(12) United States Patent
Snure et al.

(10) Patent No.: US 10,504,722 B2
(45) Date of Patent: Dec. 10, 2019

(54) GROWTH OF III-NITRIDE SEMICONDUCTORS ON THIN VAN DER WAALS BUFFERS FOR MECHANICAL LIFT OFF AND TRANSFER

(71) Applicant: Government of the United States, as represented by the Secretary of the Air Force, Wright-Patterson AFB, OH (US)

(72) Inventors: Michael R. Snure, Dayton, OH (US); Gene P. Siegel, Beavercreek, OH (US); Qing Paduano, Weymouth, MA (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 0 days.

(21) Appl. No.: 16/043,456

(22) Filed: Jul. 24, 2018

(65) Prior Publication Data

US 2019/0035624 A1 Jan. 31, 2019

Related U.S. Application Data

(60) Provisional application No. 62/536,524, filed on Jul. 25, 2017.

(51) Int. Cl.
*H01L 21/02* (2006.01)
*H01L 21/78* (2006.01)

(52) U.S. Cl.
CPC .... *H01L 21/02502* (2013.01); *H01L 21/0242* (2013.01); *H01L 21/0254* (2013.01);
(Continued)

(58) Field of Classification Search
CPC ......... H01L 21/02502; H01L 21/0242; H01L 21/02444; H01L 21/02458;
(Continued)

(56) References Cited

U.S. PATENT DOCUMENTS 9,064,698 B1 6/2015 Khakifirooz et al.
9,219,111 B2 12/2015 Kobayashi et al.
(Continued)

OTHER PUBLICATIONS

Alaskar, Y., et al., "Towards van der Waals Epitaxial Growth of GaAs on Si using a Graphene Buffer Layer," Advanced Functional Materials, vol. 24, Issue 42, Nov. 12, 2014, pp. 6629-6638 (Abstract only).
(Continued)

*Primary Examiner* — Sitaramarao S Yechuri
(74) *Attorney, Agent, or Firm* — AFMCLO/JAZ

(57) ABSTRACT

A semiconductor device includes a mechanical release layer, such as a van der Waals buffer layer, with a predetermined material roughness and thickness adjacent to a first substrate; a nucleation layer adjacent to the mechanical release layer; and a first semiconductor layer attached to the nucleation layer. The first semiconductor layer, the nucleation layer, and a portion of the mechanical release layer are releasably connected to the first substrate. The predetermined material roughness and thickness of the mechanical release layer determines a bonding strength of the first semiconductor layer to the first substrate. The semiconductor device may include an aluminum nitride insert layer adjacent to the first semiconductor layer; an aluminum gallium nitride barrier layer adjacent to the aluminum nitride insert layer; and a second semiconductor layer adjacent to the aluminum gallium nitride barrier layer. The semiconductor device may include a second substrate attached to the released first semiconductor layer.

16 Claims, 27 Drawing Sheets

(52) U.S. Cl.
CPC .... *H01L 21/0262* (2013.01); *H01L 21/02444* (2013.01); *H01L 21/02458* (2013.01); *H01L 21/02485* (2013.01); *H01L 21/02664* (2013.01); *H01L 21/7806* (2013.01)

(58) Field of Classification Search
CPC ........... H01L 21/02485; H01L 21/0254; H01L 21/0262; H01L 21/02664; H01L 21/7806
See application file for complete search history.

(56) References Cited

U.S. PATENT DOCUMENTS

| | | |
|---|---|---|
| 9,978,590 B1 | 5/2018 | Ruan et al. |
| 2011/0081519 A1 | 4/2011 | Dillingh et al. |
| 2013/0001516 A1 | 1/2013 | Hebard et al. |
| 2014/0063606 A1 | 3/2014 | Aspelmeyer et al. |
| 2014/0112363 A1 | 4/2014 | Feitisch et al. |
| 2014/0291607 A1 | 10/2014 | Kim et al. |
| 2015/0036468 A1 | 2/2015 | Boone, Jr. |
| 2015/0174656 A1 | 6/2015 | Kim |
| 2016/0027938 A1 | 1/2016 | Stoica et al. |
| 2016/0203972 A1* | 7/2016 | Sundaram ............. H01L 21/268 257/76 |
| 2016/0240692 A1 | 8/2016 | Shepard et al. |
| 2017/0047223 A1 | 2/2017 | Wang et al. |
| 2017/0053796 A1 | 2/2017 | Cheng et al. |
| 2017/0141194 A1 | 5/2017 | Shah |
| 2017/0207113 A1 | 7/2017 | Tsai et al. |
| 2017/0309762 A1 | 10/2017 | Amano |
| 2018/0076052 A1 | 3/2018 | Jin |
| 2018/0130744 A1 | 5/2018 | Chen et al. |
| 2019/0053347 A1* | 2/2019 | Lee .................... H05B 33/0857 |

OTHER PUBLICATIONS

Kobayashi, Y., et al., "Layered boron nitride as a release layer for mechanical transfer of GaN-based devices," Nature, vol. 484, Apr. 12, 2012, pp. 223-227.

Nepal, N., et al., "Epitaxial Growth of III-Nitride/Graphene Heterostructures for Electronic Devices," Applied Physics Express, vol. 6, Jun. 7, 2013, pp. 061003-1 to 061003-4.

Yoo, H., et al., "Microstructures of GaN Thin Films Grown on Graphene Layers," Advanced Materials, vol. 24, Dec. 23, 2011, pp. 515-518.

\* cited by examiner

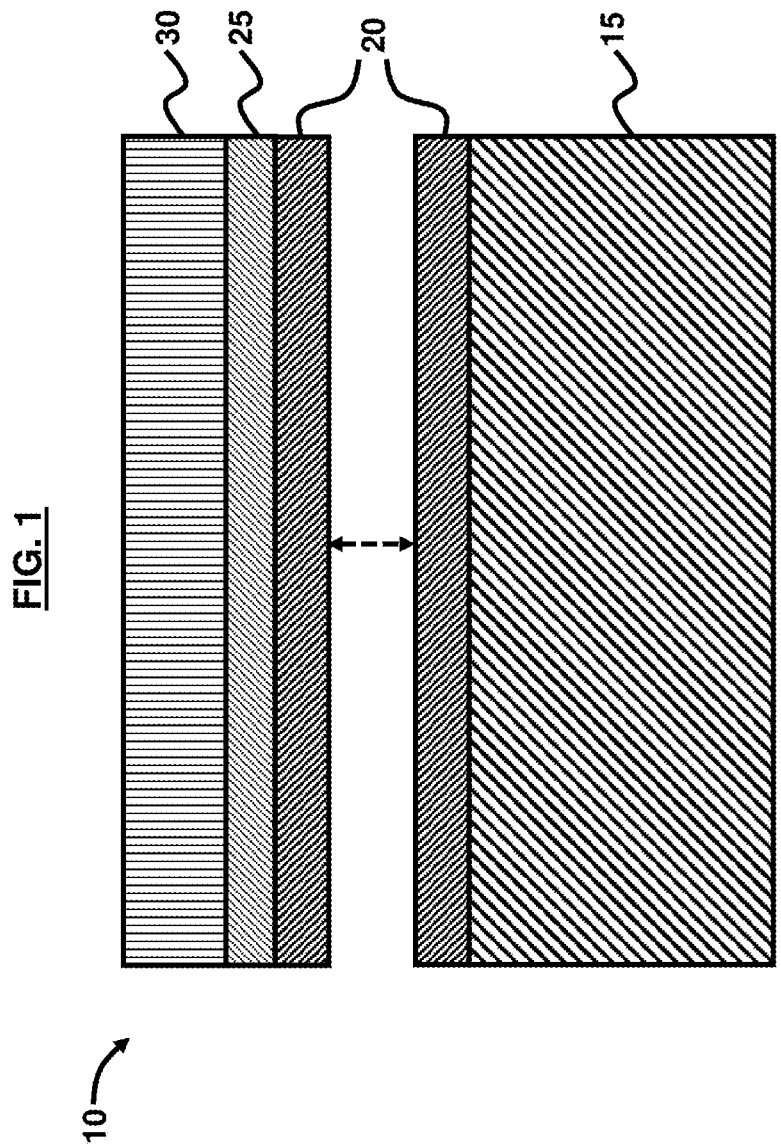

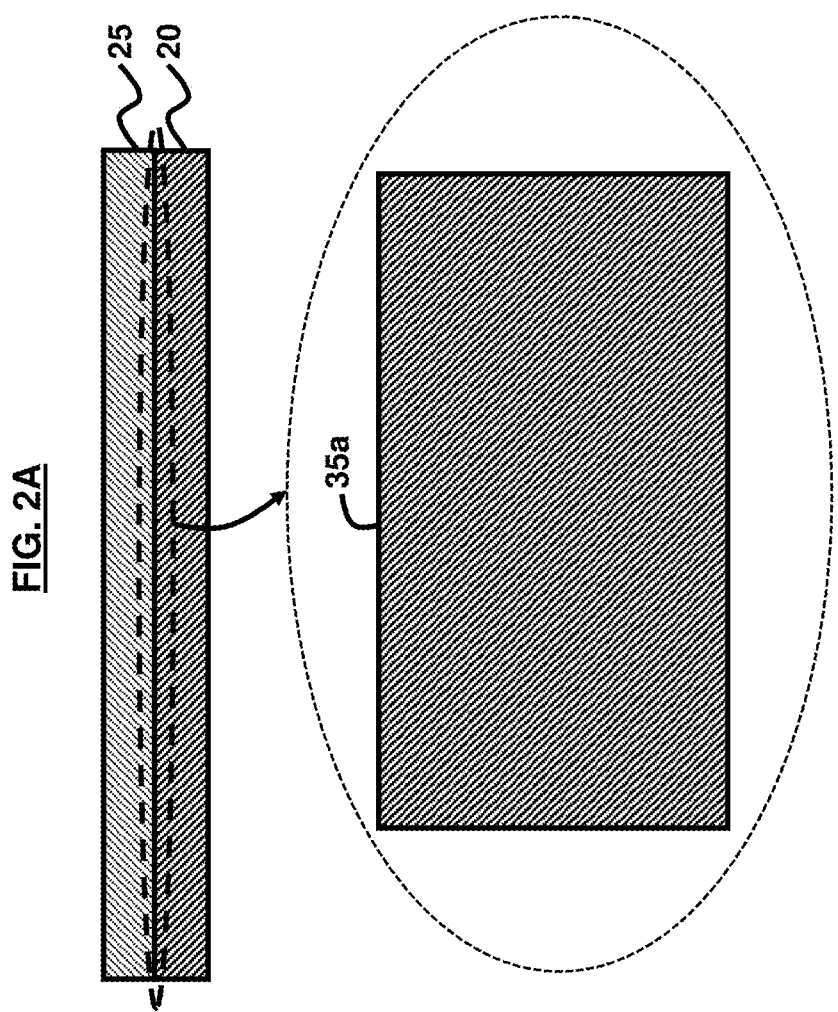

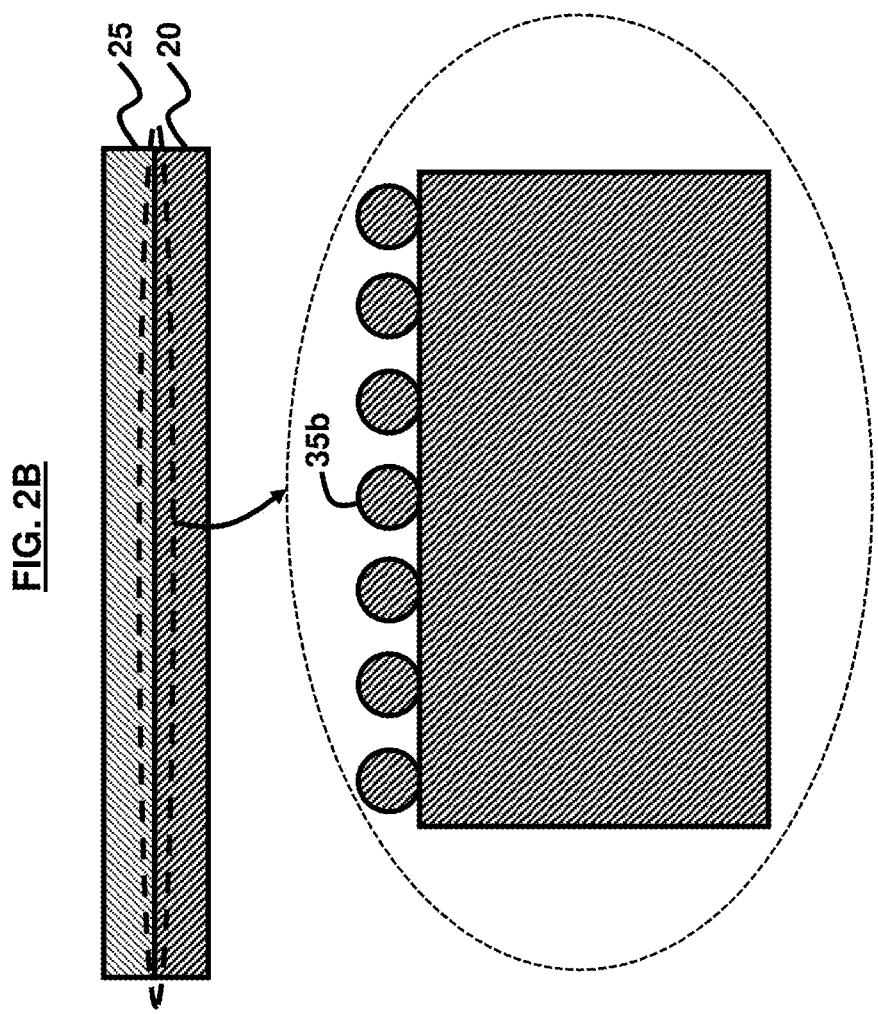

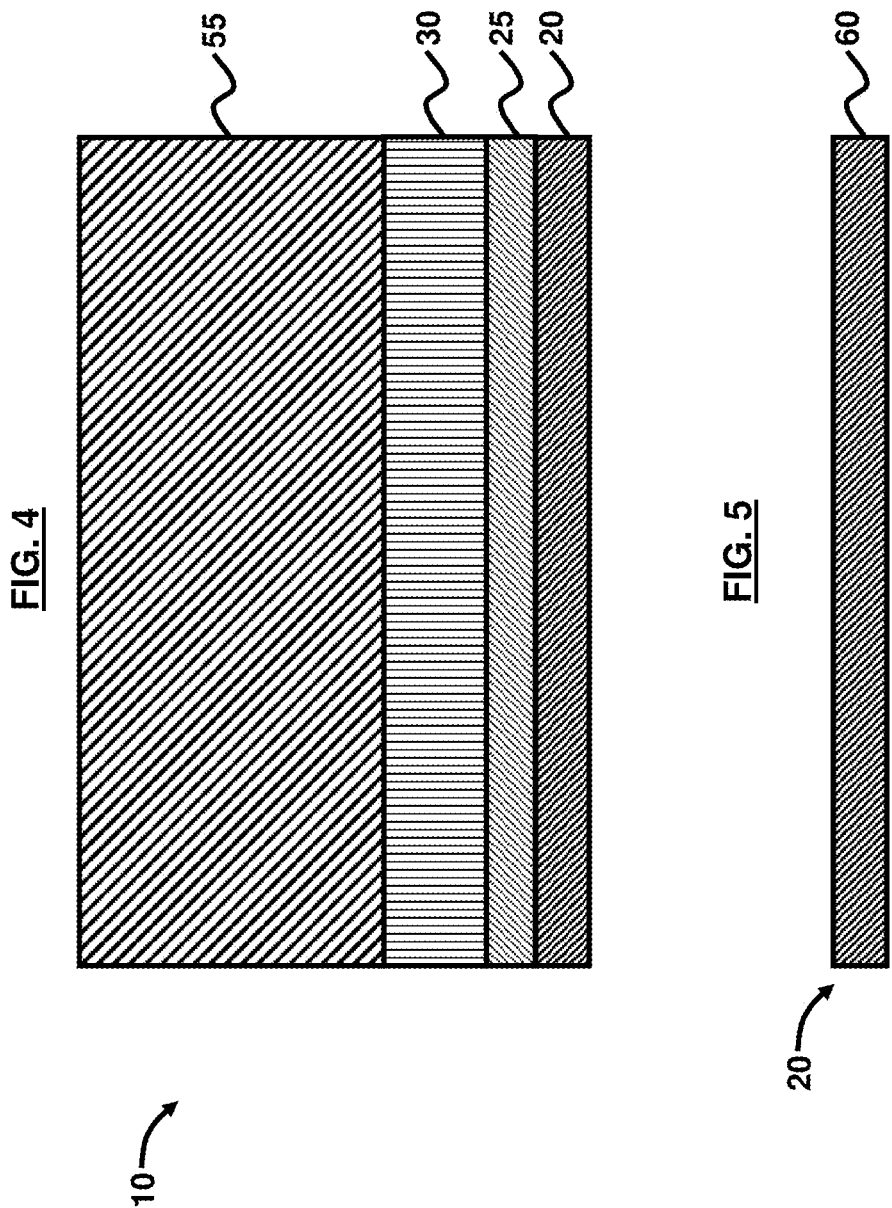

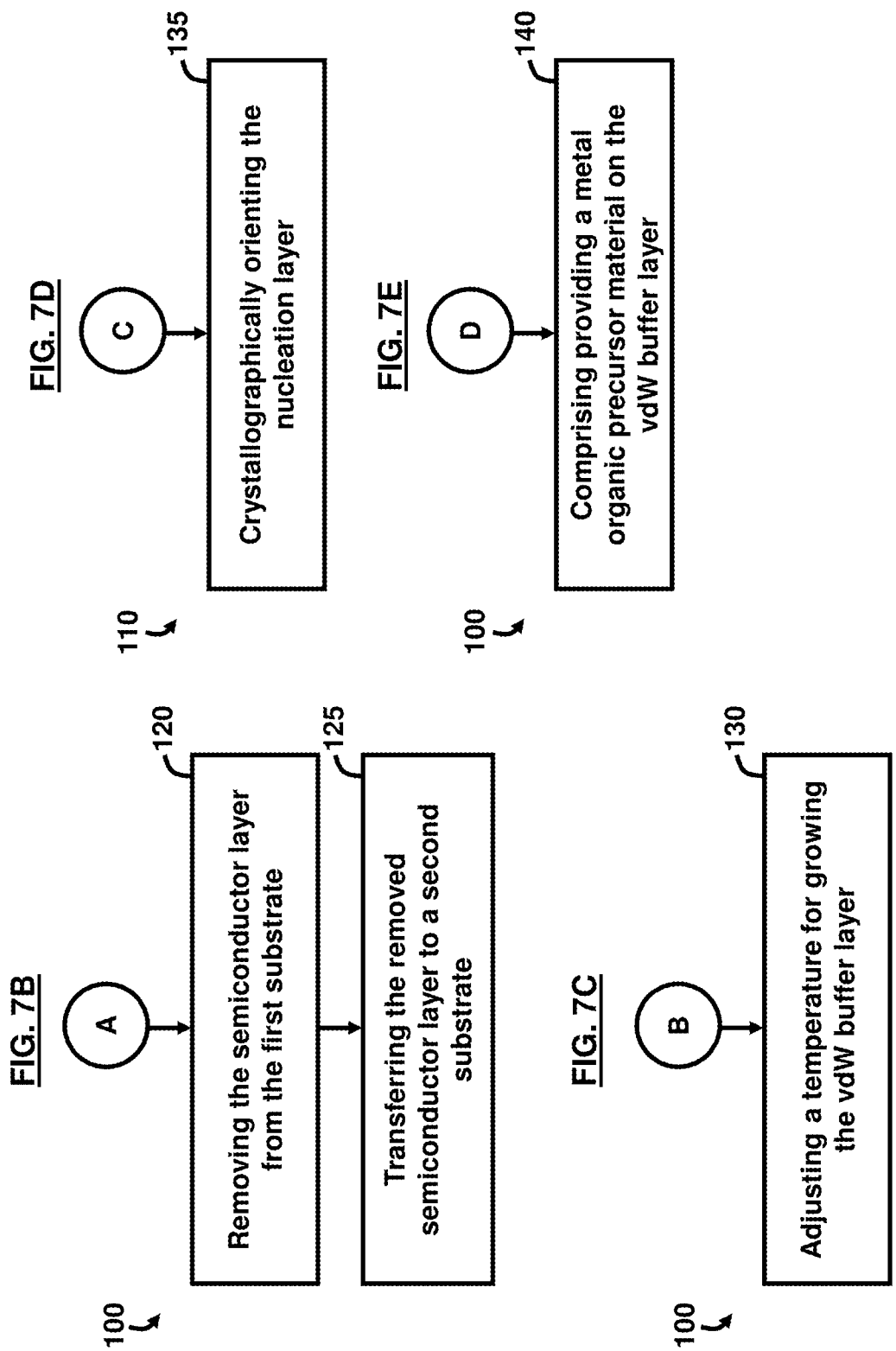

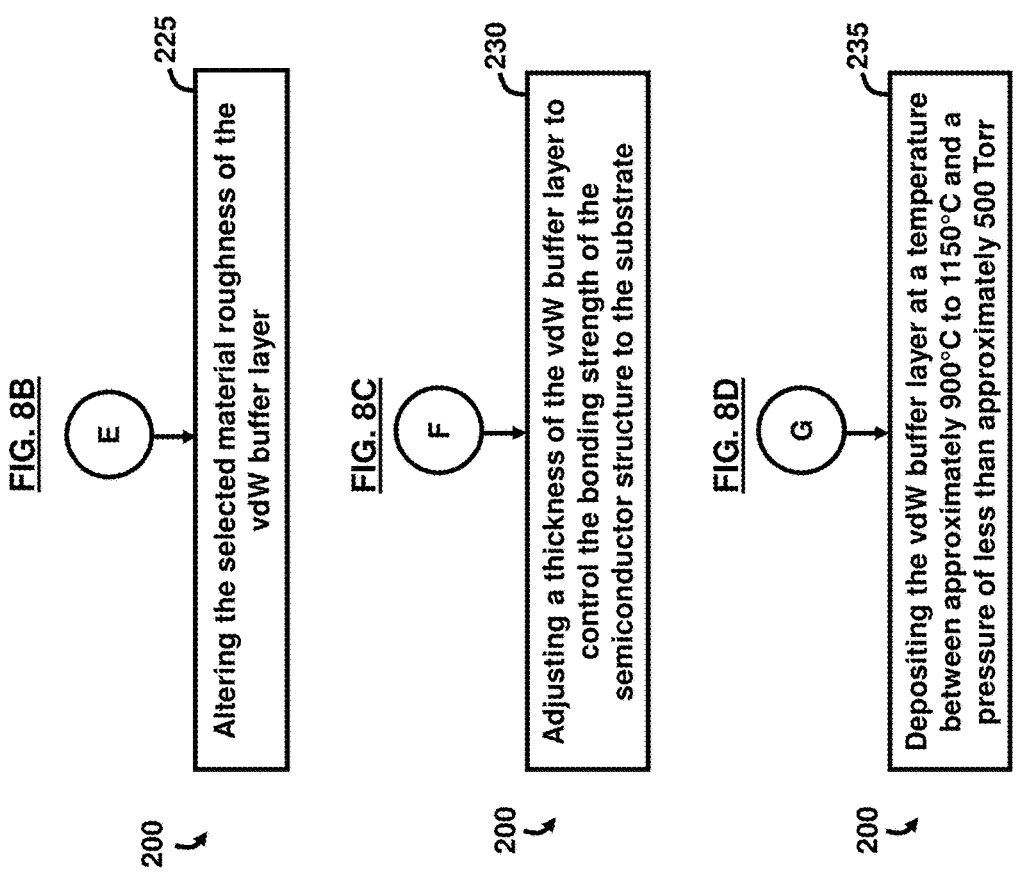

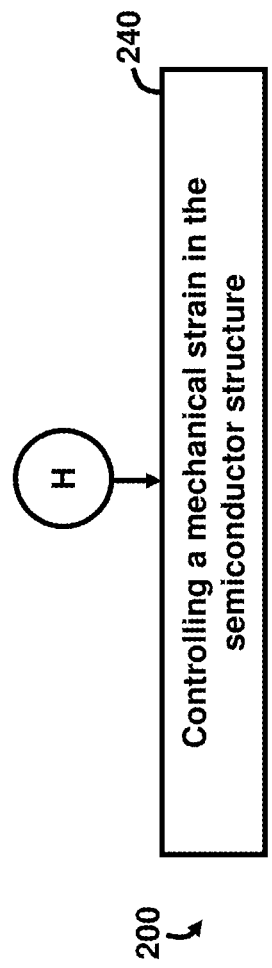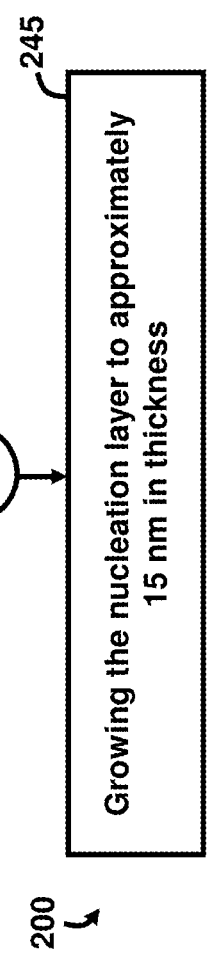

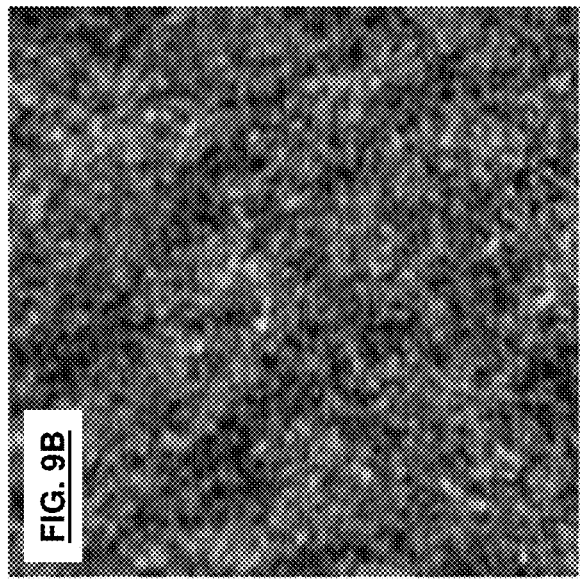
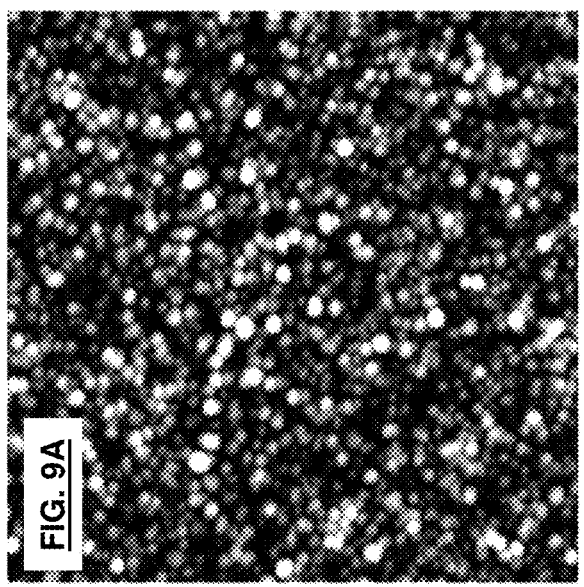

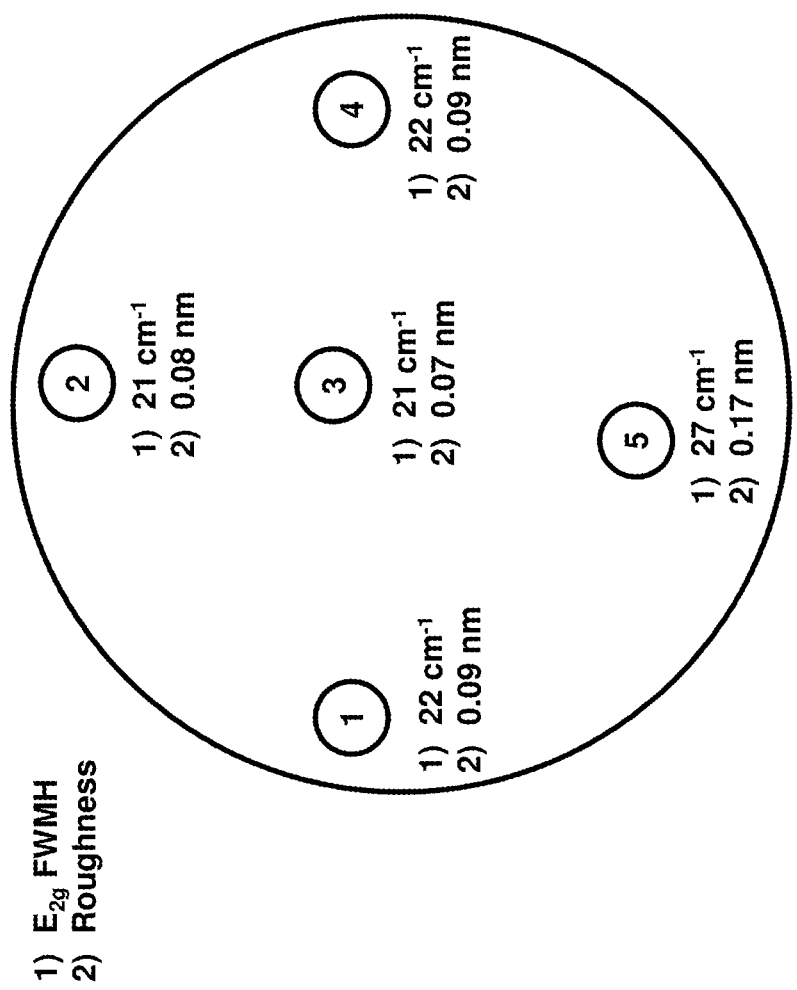

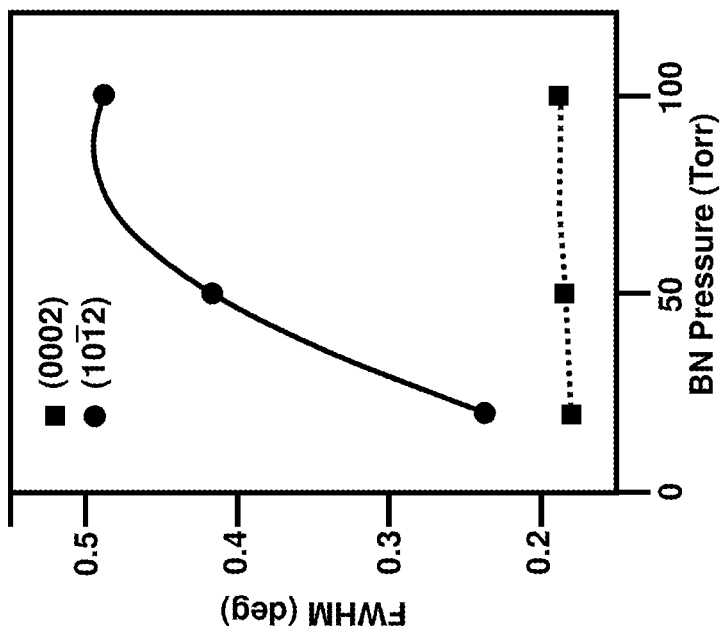
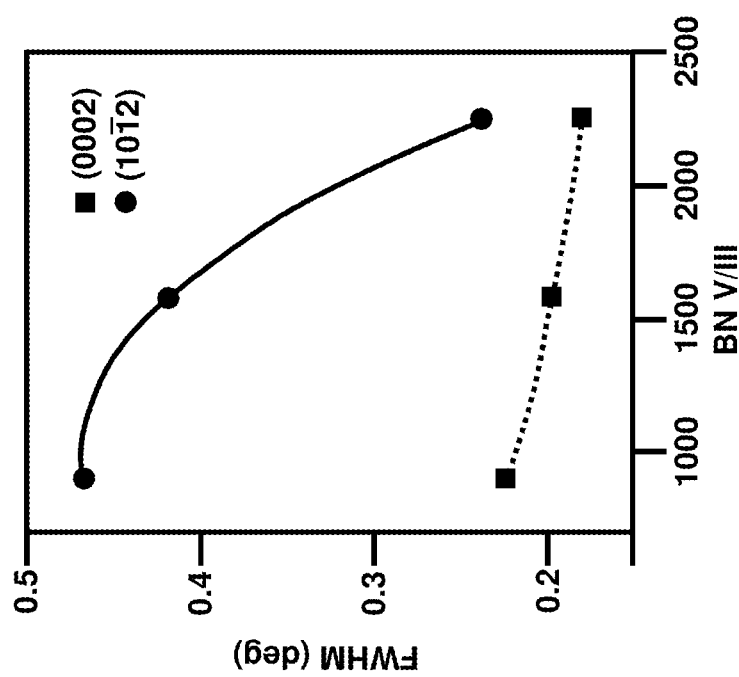
FIG. 10C
FIG. 10B

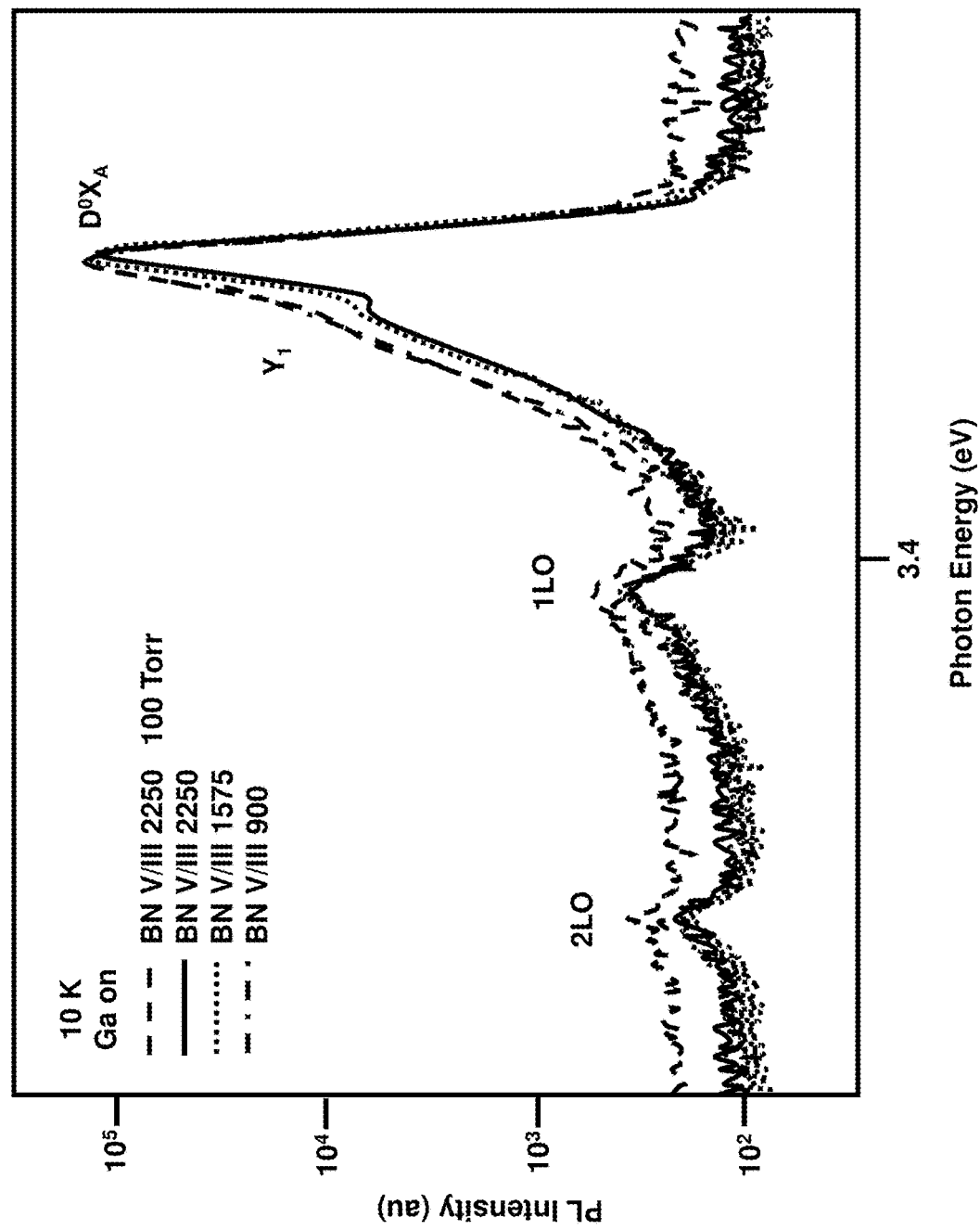

GROWTH OF III-NITRIDE SEMICONDUCTORS ON THIN VAN DER WAALS BUFFERS FOR MECHANICAL LIFT OFF AND TRANSFER

CROSS-REFERENCE TO RELATED APPLICATION(S)

This application claims the benefit of U.S. Provisional Patent Application No. 62/536,524 filed on Jul. 25, 2017, which is incorporated herein by reference in its entirety.

GOVERNMENT INTEREST

The invention described herein may be manufactured and used by or for the Government of the United States for all government purposes without the payment of any royalty.

BACKGROUND

Field of the Invention

The embodiments herein generally relate to epitaxial growth processes for semiconductor devices, and more particularly to growing group III-nitride semiconductors on thin van der Waals buffer materials for mechanical separation from the growth substrate.

Background of the Invention

Group III-nitride materials are of interest for producing electronic and opto-electronic integrated circuits that can be found in many electronic devices including solid state lighting, RADARs, and two-dimensional (2D) imaging arrays. For example, devices based on GaN, AlN, InN and their alloys are important for fabricating transistor circuits and light emitting devices. One major limitation to producing these materials and devices is the lack of low cost, large area, and high quality native substrates for their epitaxial growth. Accordingly, there is a need in the industry to develop new epitaxial growth techniques suitable for various types of applications and producing enhanced structures.

BRIEF SUMMARY OF THE INVENTION

In view of the foregoing, an embodiment herein provides a semiconductor device comprising a first substrate; a mechanical release layer comprising a predetermined material roughness and thickness adjacent to the first substrate; a nucleation layer adjacent to the mechanical release layer; and a first semiconductor layer attached to the nucleation layer, wherein the first semiconductor layer, the nucleation layer, and a portion of the mechanical release layer are configured to be releasably connected to the first substrate, and wherein the predetermined material roughness and thickness of the mechanical release layer determines a bonding strength of the mechanical release layer to the first substrate. The mechanical release layer may comprise a substantially planar surface interfacing with the nucleation layer. The mechanical release layer may comprise a substantially non-planar surface interfacing with the nucleation layer. In an example, the semiconductor device may comprise an aluminum nitride insert layer adjacent to the first semiconductor layer; an aluminum gallium nitride barrier layer adjacent to the aluminum nitride insert layer; and a second semiconductor layer adjacent to the aluminum gallium nitride barrier layer. The semiconductor device may comprise a second substrate attached to the released first semiconductor layer. The mechanical release layer may comprise a van der Waals (vdW) buffer layer.

Another embodiment provides a method comprising growing a vdW buffer layer of a predetermined material roughness and thickness on a first substrate; depositing a nucleation layer on the vdW buffer layer; and growing a semiconductor layer, wherein the semiconductor is adhered to the substrate, and wherein the semiconductor layer is characterized by a bonding strength to the first substrate that varies according to the predetermined material roughness and thickness of the vdW buffer layer. The method may comprise removing the semiconductor layer from the first substrate; and transferring the removed semiconductor layer to a second substrate. Removing the semiconductor layer from the first substrate may comprise using a mechanical lift-off process. The semiconductor layer may comprise any of GaN, AlN, InN, and alloys thereof. The method may comprise adjusting a temperature while growing the vdW buffer layer, wherein the bonding strength is further characterized by the temperature. The nucleation layer may be approximately between 5 nm and 50 nm. Depositing the nucleation layer on the vdW buffer layer may further comprise crystallographically orienting the nucleation layer by providing a metal organic precursor material; and exposing a surface of the vdW buffer layer to the metal organic precursor material to cause the nucleation layer to grow on the vdW buffer layer. The method may comprise providing a metal organic precursor material on the vdW buffer layer, wherein a ratio of nitrogen to boron in a metal organic precursor material is greater than approximately 450 to 4800.

Another embodiment provides a method comprising depositing a vdW buffer layer with a selected material roughness and thickness on a substrate; growing a nucleation layer on the vdW buffer layer by (i) pulsing a metal organic precursor material on to the vdW buffer layer to fix a polarity of a surface of the nucleation layer thereby creating a seed layer, and (ii) growing a nucleation material on the seed layer; growing a semiconductor structure on the nucleation layer to adhere the semiconductor structure to the substrate, wherein a bonding strength of the semiconductor structure to the substrate is controlled by the selected material roughness and thickness of the vdW buffer layer; and releasing the semiconductor structure from the substrate by removing at least a portion of the vdW buffer layer from the substrate. The method may comprise altering the selected material roughness of the vdW buffer layer between a root-mean-square (RMS) roughness value of less than 0.1 nm to a RMS roughness value of approximately 2 nm. The method may comprise adjusting a thickness of the vdW buffer layer to control the bonding strength of the semiconductor structure to the substrate. The method may comprise depositing the vdW buffer layer at a temperature between approximately 900° C. to 1150° C. and a pressure of less than approximately 500 Torr. The method may comprise controlling a mechanical strain in the semiconductor structure. The method may comprise growing the nucleation layer to approximately 15 nm in thickness.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1 is a cross-sectional schematic diagram illustrating an example of a semiconductor device using material property characteristics to control the bonding strength between layers in the device, according to an embodiment herein;

FIG. 2A is cross-sectional schematic diagram illustrating a first example of the interface of the mechanical release layer and the nucleation layer of the semiconductor device of FIG. 1, according to an embodiment herein;

FIG. 2B is cross-sectional schematic diagram illustrating a second example of the interface of the mechanical release layer and the nucleation layer of the semiconductor device of FIG. 1, according to an embodiment herein;

FIG. 4 is cross-sectional schematic diagram illustrating an example of the released semiconductor device of FIG. 1 attached to another substrate, according to an embodiment herein;

FIG. 5 is cross-sectional schematic diagram illustrating an example of the mechanical release layer of the semiconductor device of FIG. 1, according to an embodiment herein;

FIG. 7B is a flow diagram illustrating a method of transferring a semiconductor layer from one substrate to another substrate, according to an embodiment herein;

FIG. 7C is a flow diagram illustrating a method of adjusting a temperature while growing a mechanical release layer such as a vdW buffer layer, according to an embodiment herein;

FIG. 7D is a flow diagram illustrating a method of crystallographically orienting a nucleation layer in a semiconductor device, according to an embodiment herein;

FIG. 7E is a flow diagram illustrating a method of providing a metal organic precursor material on a vdW buffer layer, according to an embodiment herein;

FIG. 8B is a flow diagram illustrating a method of altering the material roughness of a vdW buffer layer in a semiconductor structure, according to an embodiment herein;

FIG. 8C is a flow diagram illustrating a method of adjusting a thickness of a vdW buffer layer of a semiconductor structure, according to an embodiment herein;

FIG. 8D is a flow diagram illustrating a method of depositing a vdW buffer layer in a semiconductor structure, according to an embodiment herein;

FIG. 8E is a flow diagram illustrating a method of controlling a mechanical strain in a semiconductor structure, according to an embodiment herein;

FIG. 8F is a flow diagram illustrating a method of growing a nucleation layer in a semiconductor structure, according to an embodiment herein;

FIG. 9A is an atomic force microscope (AFM) image of BN film grown at a low (450) V/III ratio, according to an embodiment herein;

FIG. 9B is AFM image of BN film grown at a high (2250) V/III ratio, according to an embodiment herein;

FIG. 9E is a schematic diagram illustrating a representation of an experimental BN film grown on a sapphire substrate at 20 Torr and a V/III ratio of 2250 and depicting various points across wafer comparing the full width at half maximum (FWHM) of the BN $E_{2g}$ peak and RMS roughness, according to an embodiment herein;

FIG. 10B is a graphical representation illustrating plots of GaN FWHM as a function of the V/III ratio for a BN substrate growth, according to an embodiment herein;

FIG. 10C is a graphical representation illustrating plots of GaN FWHM as a function of the pressure for a BN substrate growth, according to an embodiment herein;

FIG. 11B is a graphical representation illustrating PL spectra from GaN grown on four BN substrates with various morphology including BN V/III 900 (RMS>1 nm), BN V/III 1575 (RMS~0.25 nm), BN V/III 2250 (RMS<0.1 nm), and BN 2250P 100 Torr (RMS~0.4 nm) taken at 10 K, according to an embodiment herein;

DETAILED DESCRIPTION OF THE INVENTION

Figure 2C:
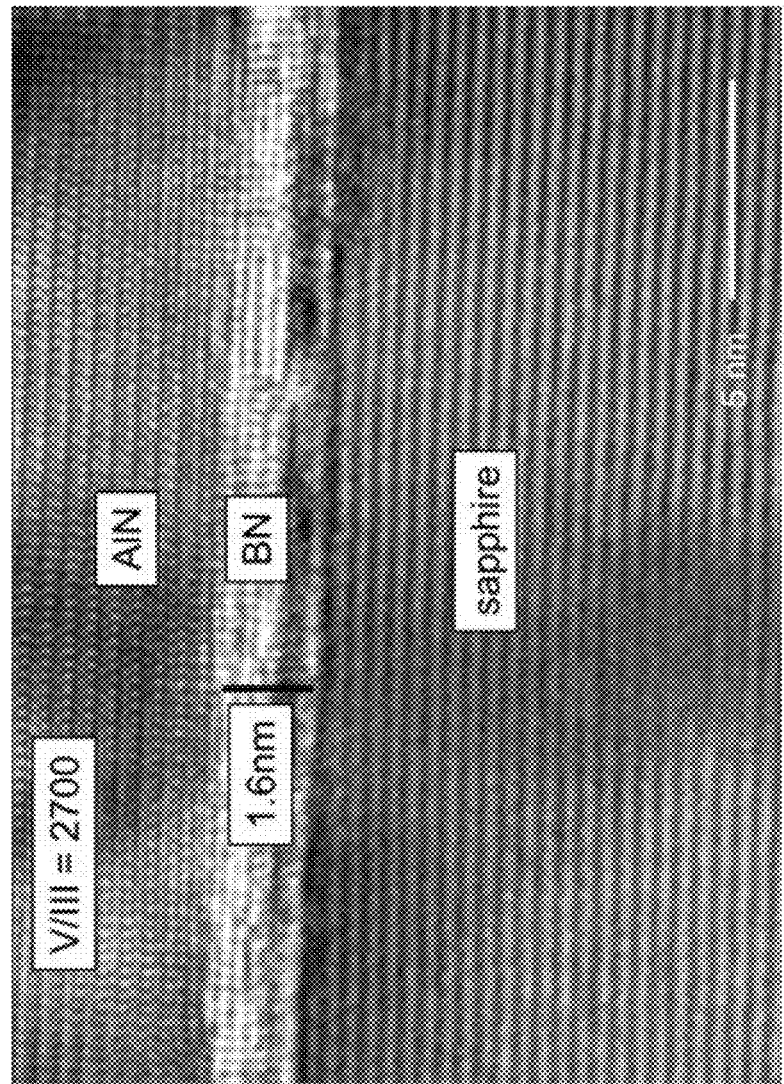
FIG. 2C is a transmission electron microscopy (TEM) image illustrating a smooth mechanical release layer on a substrate, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

The growth of III-nitride materials, films, and device structures on 2D materials, such as graphene and boron nitride (BN), is attractive for a number of applications including high brightness light emitting diodes (LEDs) and high power high frequency electronic devices. As used herein, a layer of a semiconductor structure may include one or more materials, and multiple layers may constitute a film. The weak out-of-plane van der Waals (vdW) bonding between 2D materials relaxes the strict lattice matching requirements of typical three-dimensional (3D) heterostructures and as such may reduce strain and defect density. In this regard, 2D refers to materials having one layer/unit in thickness, and 3D refers to materials having more than one layer/unit in thickness. The weak bonding between vdW layers can also be used to separate 3D materials from a growth substrate for subsequent transfer to a new substrate that provides different functionality, like flexibility, or high thermal conductivity (diamond). Such a vdW assisted transfer approach has been used to demonstrate GaN LEDs on flexible substrates and AlGaN/GaN high electron mobility transistors (HEMT) on Cu substrates. These transferred devices showed significant enhancement over their as grown counterparts, due to strain relaxation and improved properties of the new substrate.

Methods for lifting devices off of a growth substrate for transfer to another substrate are provided. One method uses a vdW buffer layer as a mechanical release layer. As used herein, vdW materials are layered compounds, like graphite, hBN, molybdenite, etc., with strong chemical bonding in plane and weak dispersive bonding between layers. The weak bonding between vdW layers enables the mechanical separation at the interface between two vdW layers, a vdW layer and the substrate, or the vdW layer and the III-nitride material, or film. Crystalline and epitaxial III-nitride films can be grown on vdW buffer layers by chemical vapor deposition (CVD). The inert nature and lack of dangling bonds on a vdW surface presents significant challenges to epitaxial growth. As such, a number of different nucleation approaches have been used for growth on vdW BN and graphene including nucleation layers (ZnO, AlN, GaN, or $Al_xGa_{1-x}N$) or surface functionalization. After the nucleation step, films and device structures are grown.

As mentioned, there are significant challenges to growth of high quality epitaxial materials. These challenges are primarily due to a lack of dangling bonds on the surface of 2D materials making nucleation difficult. There are some salient advantages to using BN including excellent dielectric properties and chemical resistance, which can serve to isolate and protect the GaN device structure. In an example, a thin AlN nucleation layer may be used for growth of high quality AlGaN/GaN heterostructures on few-layer BN on sapphire, with very high 2D electron gas (2 DEG) mobility. Although the AlN nucleation has little impact on the properties of the AlGaN/GaN heterostructure, the BN substrate morphology might. Therefore, the embodiments herein utilize the effect of BN substrate morphology on the properties of bulk GaN and AlGaN/GaN heterostructures, wherein there is a clear relation between BN roughness and GaN crystallinity and transport properties. Moreover, there is a correlation between BN roughness and GaN separation, which allows for the optimization/selection of the BN substrate based on a desired application need.

The embodiments disclosed herein provide a semiconductor layer, such as group III nitride (e.g., group III-N) thin film or structure, for mechanical lift-off from a first substrate, which can be configured for epitaxial growth, and transferred to a second substrate, which can be arbitrarily selected according to one or more applications or desirable features. The semiconductor layer is grown epitaxially on a mechanical release layer, such as a thin hBN vdW buffer layer, using an intervening nucleation layer. In some embodiments, the nucleation layer can be a thin AlN nucleation layer. As such, the embodiments disclosed herein improve upon the use of a vdW buffer layer as a mechanical release layer for III-nitride films and devices. While epitaxial group III-N films may be grown on the vdW buffer layers by chemical vapor deposition, the lack of dangling bonds in the vDdW buffer layer typically requires a nucleation layer to promote growth. The embodiments disclosed herein can significantly improve the crystal quality of the epitaxial films by using at least one thin high quality AlN nucleation layer deposited in a two-step approach.

Consequently, according to present embodiments, the bonding strength of the semiconductor layer can be varied and/or controlled according to one or more properties of the mechanical release layer. For example, in embodiments where the mechanical release layer is an hBN van der Waals buffer layer and the semiconductor layer is a III-nitride film, the morphology of the hBN buffer can be varied or leveraged to control the bonding strength of the III-nitride films to the growth substrate. It will be appreciated that controlling bonding strength can be important based on the desired application, or potential processing, of the III-nitride films. Whereas weakly bonded films can be easily separated and transferred for simple processing, more strongly bonded films are necessary for aggressive pre-transfer device processing. Embodiments disclosed herein allow for the bond strength of the film to the substrate to be varied by leveraging the morphology of the mechanical release layer to make mechanical lift-off easier. Moreover, the embodiments herein allow for greater yield in a semiconductor structure upon removal from the growth substrate. Epitaxial growth technology has been developed using crystalline non-native substrates such as, sapphire, SiC, and Si.

Referring now to the drawings, and more particularly to FIGS. 1 through 13A, where similar reference characters denote corresponding features consistently throughout, there are shown exemplary embodiments. In the drawings, the size and relative sizes of layers and regions may be exaggerated for clarity.

FIG. 1 is a cross-sectional schematic diagram illustrating an example of a semiconductor device 10 using material property characteristics to control the bonding strength between layers in the device 10, according to an embodiment herein. The semiconductor device 10 comprises a first substrate 15. In some examples, the first substrate 15 may comprise sapphire or SiC material, among other types of materials. The first substrate 15 may be configured in any suitable size, shape, or thickness, according to various examples.

A mechanical release layer 20 comprising one or more material properties such as a predetermined material roughness and thickness is provided adjacent to the first substrate 15. A portion of the mechanical release layer 20, along with other attached layers as described below, are provided to be released from the semiconductor device 10 during subsequent processing. In an example, the mechanical release layer 20 is formed of a plurality of sub-layers. The sub-layer of the mechanical release layer 20 closest to the first substrate 15 is more strongly bonded to the first substrate 15 and this bonding strength is screened as the number of sub-layers increases. For example, by the third or fourth sub-layer away from the first substrate 15, the bonding effect of the first substrate 15 is completely screened. Accordingly, using a one or two sub-layer mechanical release layer 20 results in a much stronger bonding strength between the mechanical release layer 20 and the first substrate 15.

A well-aligned mechanical release layer 20 with small interplanar spacing has the greatest bonding strength (i.e., the strongest interaction with the first substrate 15, or the hardest to pull apart from the first substrate 15) due to the dispersive (i.e., Lennard-Jones type) forces holding the various sub-layers together and high surface area between the mechanical release layer 20 and the first substrate 15. Some examples of the mechanical release layer 20 include a vdW buffer layer, graphene, $MoS_2$, $MoSe_2$, $WS_2$, and $WSe_2$, among others. For example, graphene is generally a thermally-stable material that has a high-decomposition temperature, which may be suitable for various types of applications. In this regard, the graphene may be configured as multi-layer graphene (MLG) flakes. As such, the graphene may be a film comprising one or more layers. In an example, the mechanical release layer 20 comprising graphene may have a honeycomb crystal structure. The one or more material properties of the mechanical release layer 20 such as the predetermined material roughness and thickness are used to control or modify the bonding/adhesion of the mechanical release layer 20 in the semiconductor device 10. Other ways to modify the boding/adhesion (e.g., other than the roughness and thickness) include controlling the moisture of the mechanical release layer 20 by exposing the mechanical release layer 20 to air with different levels of humidity. Accordingly, moisture can decrease the bonding/adhesion of the mechanical release layer 20.

A nucleation layer 25 is provided adjacent to the mechanical release layer 20. In an example, the nucleation layer 25 may be approximately 15 nm in thickness. Some examples of the nucleation layer 25 are AlN, low temperature GaN, AlGaN, and ZnO, among others. A first semiconductor layer 30 is attached to the nucleation layer 25. In an example, the first semiconductor layer 30 comprises a group III-nitride material. In other examples, the first semiconductor layer 30 comprises any of GaN, AlN, and AlGaN alloys. Furthermore, in other examples, In and InN alloys may be included with GaN and AlN, and B alloys may be included with GaN, InN, and AlN. In an example, the first semiconductor layer 30 may be approximately 2 μm in thickness. When the first semiconductor layer is grown on a strongly bonded mechanical release layer 20, more mechanical energy can be required to remove the semiconductor layer 30 from the first substrate 15, making embodiments of the present disclosure well-suited for pre-lift-off device fabrication. Conversely, when employing a weakly bonded mechanical release layer 20, present embodiments can allow for very low impact, simple lift-off processes that suitable for delicate structures, handling, and processing.

As described above, the first semiconductor layer 30, the nucleation layer 25, and a portion of the mechanical release layer 20 are configured to be releasably connected to the first substrate 15. Accordingly, in one example, the thickness of the mechanical release layer 20, which is determined by the number of sub-layers in the mechanical release layer 20, affects the bonding strength between the mechanical release layer 20 and the first substrate 15. The bonding strength determines the ease or difficultly in releasing the mechanical release layer 20 (along with the nucleation layer 25 and the first semiconductor layer 30) from the first substrate 15, and wherein the one or more properties such as the predetermined material roughness and thickness of the mechanical release layer 20 determines a bonding strength of the first semiconductor layer 30 to the first substrate 15.

The roughness of the mechanical release layer 20 may be controlled based on the processing techniques used to form the mechanical release layer 20, among other factors. FIG. 2A, with reference to FIG. 1, is cross-sectional schematic diagram illustrating that the mechanical release layer 20 may comprise a substantially smooth, planar surface 35a interfacing with the nucleation layer 25. A mechanical release layer 20 with atomically smooth surfaces and well-ordered layered stacking may be used for more strongly bonded structures. Accordingly, the substantially smooth, planar surface 35a may be considered to have a low roughness value. Examples of the low roughness value are described in more detail with respect to the experimental results below. This type of mechanical release layer 20 (e.g., substantially smooth, planar surface 35a) allows for a structure such as a HEMT or heterostructure field effect transistor (HFET) to be processed without separating from the first substrate 15. Processing steps including mesa etching, metallization, deposition of gate dielectrics, annealing to >800 C, and deposition of thick surface passivation layers are performed. After these steps, device and films (e.g., nucleation layer 25, first semiconductor layer 30, and part of the mechanical release layer 20) remain in contact with the first substrate 15. The device structure (e.g., nucleation layer 25, first semiconductor layer 30, and part of the mechanical release layer 20) can then be separated from the first substrate 15 and transferred to an arbitrary substrate, as described below, using wet or dry transfer techniques.

FIG. 2B, with reference to FIGS. 1 and 2A, is cross-sectional schematic diagram illustrating that the mechanical release layer 20 may comprise a substantially non-planar surface 35b interfacing with the nucleation layer 25. A mechanical release layer 20 with less-ordered, rough, ball-like surfaces may be used for more weakly bonded structures. Accordingly, the non-planar surface 35b may be considered to have a high roughness value (e.g., >0.5 nm RMS), and accordingly a higher roughness value than the substantially smooth, planar surface 35a. Other examples of the high roughness value are described in more detail with respect to the experimental results below. Additionally, according to some other examples, structural morphologies somewhere between the substantially planar surface 35a and the substantially non-planar surface 35b for the mechanical release layer 20 may be used.

Figure 2D:
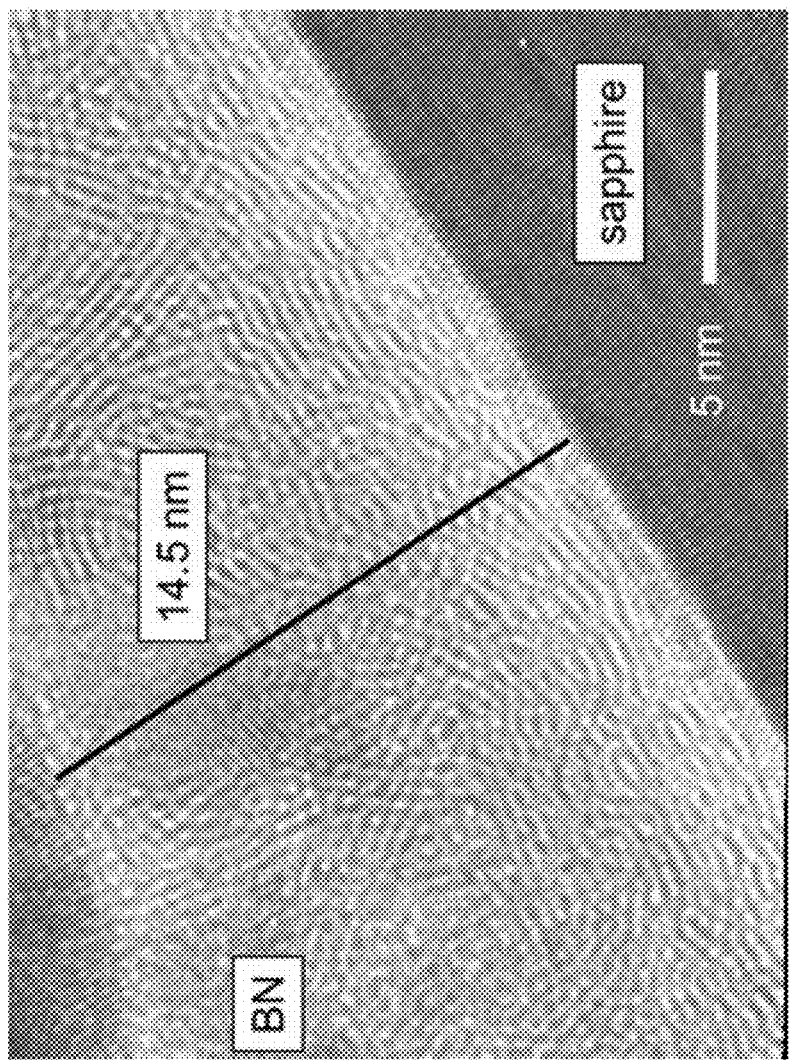
FIG. 2D is a TEM image illustrating a rough, ball-like mechanical release layer on a substrate, according to an embodiment herein.

FIGS. 2C and 2D, with reference to FIGS. 1 through 2B, illustrate examples of comparative TEM images of certain illustrated embodiments. In the illustrated embodiment of FIG. 2C, the mechanical release layer 20 comprises a well-ordered layered stacking of four sub-layers comprising hBN. This hBN mechanical release layer 20 was grown by chemical vapor deposition from triethylborane (TEB) and ammonia. To achieve this ordered structure and thickness, films were grown at temperatures in the range of 900° to 1100° C., at low pressure (<100 Torr) and under a high ratio (>1800) of nitrogen ($NH_3$) to boron precursor. FIG. 2D shows a TEM image of a hBN mechanical release layer 20 with a rough, ball-like morphology. Films were grown from the same precursors, in the same CVD system, and in the same temperature range as the ordered sample shown in FIG. 2C, but at higher pressures (>200 Torr) and/or lower nitrogen-to-boron ratio (<900). Films with a morphology between these two extremes were achieved by growing at a pressure<100 Torr and nitrogen to boron ratio between 900 and 1800. It will be appreciated that other methods can be used to produce the mechanical release layer 20 with similar morphologies, such as MBE, MOCVD, ALD, sputtering, or PLD, etc. to achieve similar variable bonding.

Figure 3:
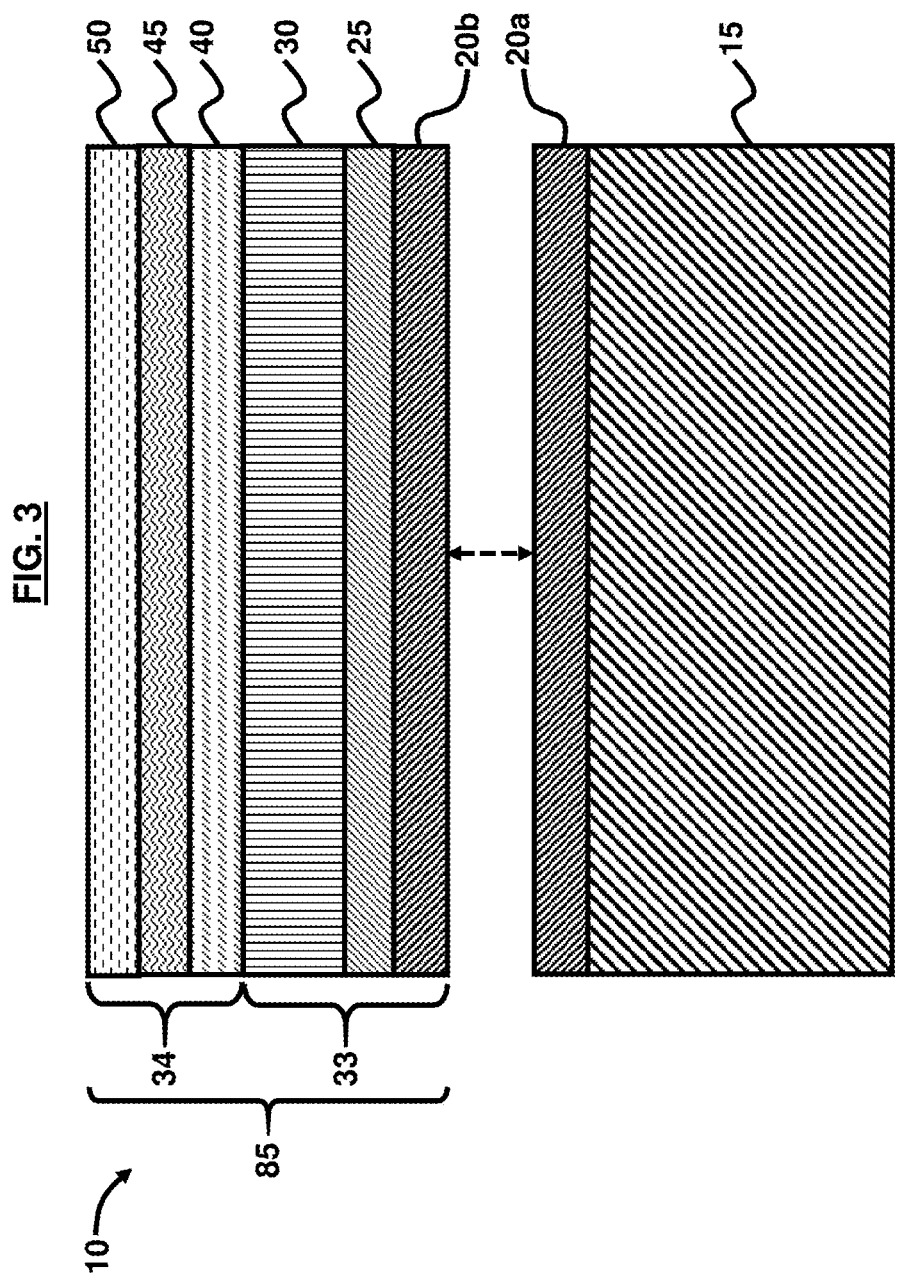
FIG. 3 is cross-sectional schematic diagram illustrating an example of the semiconductor device of FIG. 1 with additional layers thereon, according to an embodiment herein.

FIG. 3, with reference to FIGS. 1 through 2D, is cross-sectional schematic diagram illustrating that the semiconductor device 10 may comprise a semiconductor film 34 comprising an aluminum nitride insert layer 40 adjacent to the first semiconductor layer 30, an aluminum gallium nitride (AlGaN) barrier layer 45 adjacent to the aluminum nitride insert layer 40, and a second semiconductor layer 50 adjacent to the aluminum gallium nitride barrier layer 45. In an example, the AlN insert layer 40 may be approximately 2 nm in thickness, and the AlGaN barrier layer 45 may be approximately 17 nm in thickness. According to an example, the AlGaN barrier layer 45 may be $Al_{0.27}Ga_{0.73}N$. In an example, the second semiconductor layer 50 may comprise any of GaN, SiN, BN, InN, GaAs, GaP, and organic polymers. According to an example, the second semiconductor layer 50 may be approximately 3 nm in thickness. A portion of the mechanical release layer 20a is not removed from the first substrate layer 15, and accordingly, as used herein, the removed layers of the partial mechanical release layer 20b, the nucleation layer 25, and the first semiconductor layer 30 are collectively referred to as the semiconductor layer 33. As used herein, the semiconductor layer 33 and the semiconductor film 34 may be collectively referred to as a semiconductor structure 85.

The AlGaN barrier layer 45 in contact with the second semiconductor layer 50 produces a conductive charge layer at this interface by (i) producing a polarization mismatch due to the difference in the spontaneous and piezo polarization, and (ii) bending of the band structure due to band gap misalignment. This conductive charge layer is a two-dimensional electron gas (2 DEG) layer and is responsible for free carriers (electrons), and confines these carriers. Some alternatives to the AlGan barrier layer 45 may be AlInN, AlGaInN, AlScN, and AlN. The second semiconductor layer 50 may prevent oxidation of the AlGaN barrier layer 45.

FIG. 4, with reference to FIGS. 1 through 3, is cross-sectional schematic diagram illustrating that the semiconductor device 10 may comprise a second substrate 55 attached to the released first semiconductor layer 30. In some examples, the second substrate 55 may be an arbitrary substrate to be used for producing any number of devices such as light emitting diodes, laser diodes, bipolar junction transitions, etc. Some examples of the second substrate 55 include semiconductors (e.g., Si, GaAs, Ge, etc.), metals (e.g., Cu, Au, etc.), plastics (polyethylene terephthalate (PET), polyimide, etc.) ceramics/insulators (e.g., sapphire, MgO, etc.), and diamond.

FIG. 5, with reference to FIGS. 1 through 4, is cross-sectional schematic diagram illustrating that the mechanical release layer 20 may comprise a vdW buffer layer 60. As mentioned, other example alternatives for the mechanical release layer 20 may include graphene, $MoS_2$, $MoSe_2$, $WS_2$, and $WSe_2$, among others. The vdW buffer layer 60 may comprise one or more sub-layers as described above with respect to the mechanical release layer 20.

Figure 6:
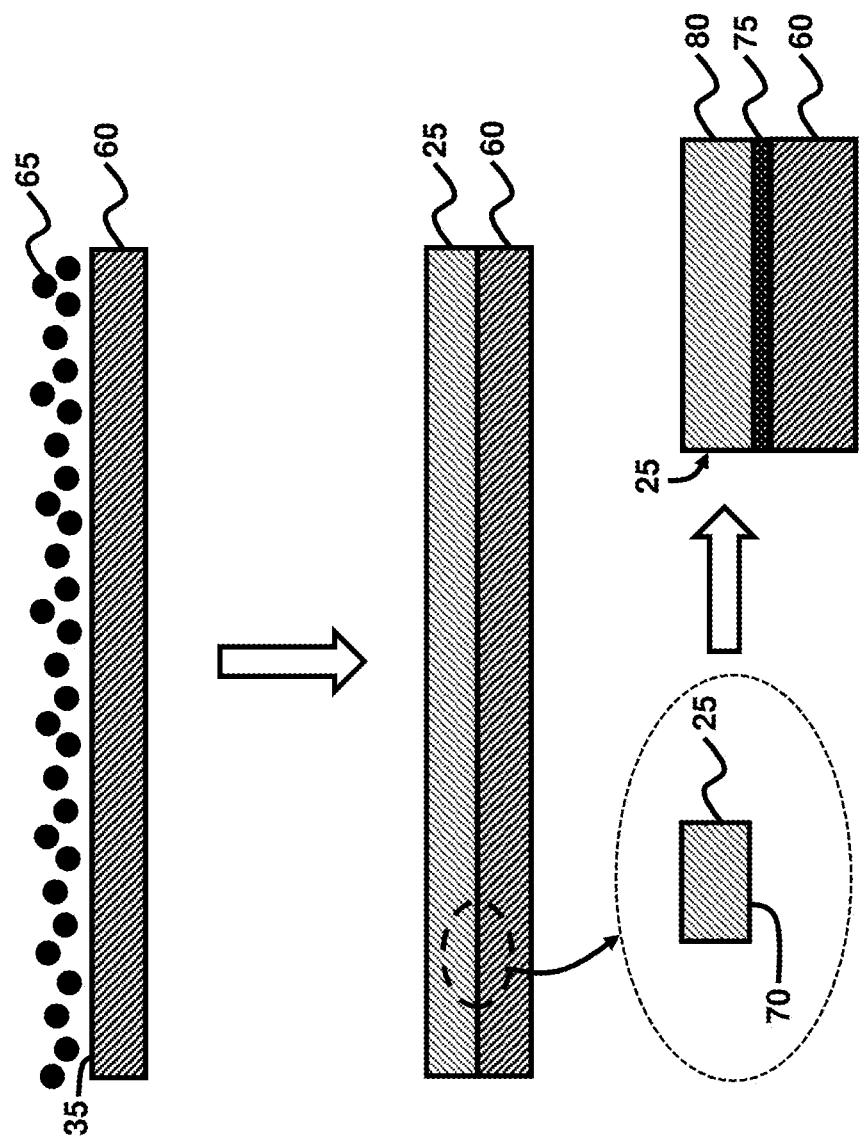
FIG. 6 are cross-sectional schematic diagrams illustrating exposing the mechanical release layer of the semiconductor device of FIG. 1 to a metal organic precursor material to cause the nucleation layer to grow, according to an embodiment herein.

FIG. 6, with reference to FIGS. 1 through 5, are cross-sectional schematic diagrams illustrating that a surface 35 of the vdW buffer layer 60 is exposed to a metal organic precursor material 65 to cause the nucleation layer 25 to grow on the vdW buffer layer 60. In an example, the surface 35 of the vdW buffer layer 60 is exposed to the metal organic precursor material 65 for temporally (e.g., 1 to 10 seconds, for example). The metal organic precursor material 65 is pulsed to the vdW buffer layer 60 to fix a polarity of a surface 70 of the nucleation layer 25 thereby creating a seed layer 75. In this regard, the seed layer 75 may refer to a thin, catalyst film used to improve the growth process above the vdW buffer layer 60. A nucleation material 80 is grown on the seed layer 75. According to some examples, the metal organic precursor material 65 may include any of Ga-trimethylgallium (TMG), triethylgallium (TEG), Al-trimethylaluminum (TMA), B-trimthylboron (TEB), Ga-dimethylgalliumhydride (DMGaH), gallium trimethlamines (TMAG), gallium triethlamines (TEAG), Al-dimethylaluminumhydride (DMAlH), and B-trimthylboron (TEB), among others.

Figure 7A:
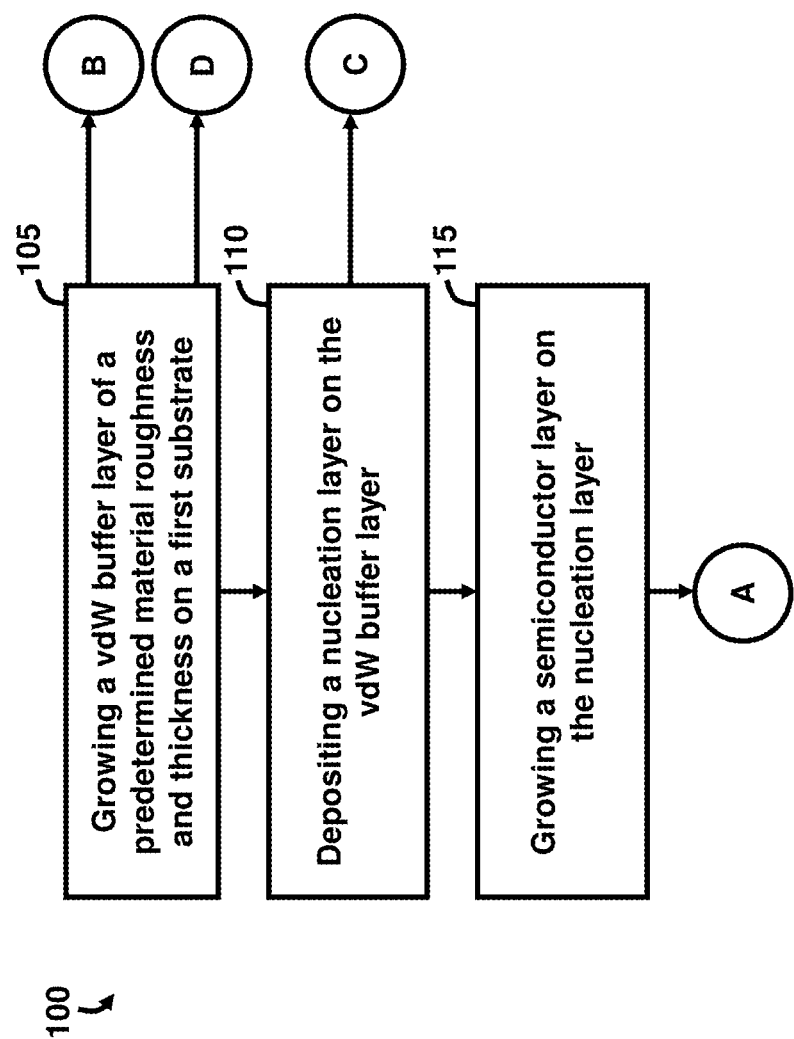
FIG. 7A is a flow diagram illustrating a method of performing epitaxial growth of a semiconductor device, according to an embodiment herein.

FIG. 7A, with reference to FIGS. 1 through 6, is a flow diagram illustrating a method 100 of performing epitaxial growth of a semiconductor device 10, according to an embodiment herein. The method 100 comprises growing (105) a vdW buffer layer 60 of a predetermined material roughness and thickness on a first substrate 15. Accordingly, through careful control of the process parameters, the morphology of the vdW buffer layer 60, which may be BN, may be varied from an ultra-thin, (1.6 nm) atomically smooth surface (RMS<0.1 nm) to a very rough film (RMS~2 nm), which allows for further analysis of its effect on GaN properties. In some examples, the vdW buffer layer 60 may be grown using MOCVD or molecular beam epitaxy (MBE) techniques. For example, the vdW buffer layer 60 may be grown in a high vacuum or in an inert gas atmosphere. The method 100 further comprises depositing (110) a nucleation layer 25 on the vdW buffer layer 60. For example, the nucleation layer 25 may be deposited on the vdW buffer layer 60 using a multi-step MOCVD process for AlN including providing pulse Al metal organic precursors such as TMA with no $NH_3$ at approximately 1000° C., and starting the flow of $NH_3$ and the TMA at approximately 1000° C.

The method 100 further comprises growing (115) a semiconductor layer 33 on the nucleation layer 25, wherein the semiconductor layer 33 is characterized by a bonding strength to the first substrate 15 that varies according to the predetermined material roughness and thickness of the vdW buffer layer 60. As described above, the thickness of the vdW buffer layer 60 may be determined by the number of sub-layers of film contained in the vdW buffer layer 60.

FIG. 7B, with reference to FIGS. 1 through 7A, is a flow diagram illustrating that the method 100 may comprise removing (120) the semiconductor layer 33 from the first substrate 15 by partially removing the vdW buffer layer 60 from the first substrate 15. The semiconductor layer 33 may comprise any of GaN, AlN, InN, and alloys thereof. The process of removing (120) may occur by separating the vdW buffer layer 60 from the first substrate 15 using any suitable chemical and/or mechanical technique. In an example, the removing (120) involves self-separation of the mechanical release layer 20 from the first substrate 15 at RT. The method 100 further comprises transferring (125) the removed semiconductor layer 33 to a second substrate 55, wherein the second substrate 55 is different from the first substrate 15. In an example, the transferring process (125) may include dry transfer processes such as elastomeric stamp transfer/printing, thermal release tape transfer, and picking up with a tweezer or needle, etc., as well as wet transfer processes such as using a buffer oxide etch (BOE) that creates hydrogen bubbles at interface of the first substrate 15 and the vdW buffer layer 60, which assists in the release process of the vdW buffer layer 60 from the first substrate 15. Accordingly, removing (120) the semiconductor layer, and more particularly, the vdW buffer layer 60, from the first substrate 15 may comprise using a mechanical lift-off process, according to an example.

FIG. 7C, with reference to FIGS. 1 through 7B, is a flow diagram illustrating that the method 100 may comprise adjusting (130) a temperature while growing the vdW buffer layer 60, wherein the bonding strength of the semiconductor layer 33 is further characterized by the growing temperature. For example, the growing temperature may be adjusted anywhere between 900° C. to 1100° C., according to an example. However, different types of devices (e.g., CVD reaction chambers being purged with hydrogen and/or inert gas) used for the growth processes may determine the temperature that may be used for the growth.

In an example, the nucleation layer 25 may be approximately between 5 nm and 50 nm. For example, a thin AlN nucleation layer 25 between 5 and 50 nm may be used to achieve high quality III-nitride films. In one specific example, a 15 nm nucleation layer 25 may be used to achieve enhanced results. It will be appreciated that a nucleation layer 25 that is too thick will strain the III-nitride film (e.g., first semiconductor layer 30) during growth causing it to self-separate above some critical thickness during the growth process. A thin nucleation layer 25 may have a higher roughness, which affects the film quality. For example, a nucleation layer 25 less than 5 nm may form voids or pin holes due to incomplete coalescence of the nucleation layer 25 greatly reducing the film quality.

FIG. 7D, with reference to FIGS. 1 through 7C, is a flow diagram illustrating that depositing (110) the nucleation layer 25 on the vdW buffer layer 60 may further comprise crystallographically orienting (135) the nucleation layer 25 by providing a metal organic precursor material 65; and exposing a surface 35 of the vdW buffer layer 60 to the metal organic precursor material 65 to cause the nucleation layer 25 to grow on the vdW buffer layer 60. In the context of the embodiments herein, crystallographically orienting (135) the nucleation layer 25 refers to the crystal structure of the nucleation layer 25 (e.g., AlN, for example) being aligned with a single orientation to the first substrate 15. The nucleation layer 25 is crystallographically oriented to achieve high crystal quality in the subsequent III-nitride films (e.g., the semiconductor layer 33), which may further improve structural, magnetic, and optical properties of the semiconductor layer 33. A single crystal or mono crystalline solid structure contains a continuous crystal lattice without grain boundaries, which may be used as high-quality semiconductor materials for the semiconductor layer 33.

This is achieved using a two-step process: first the surface 35 of the vdW buffer layer 60 is coated by exposing it to an Al metal organic precursor material 65 (for example, trimethylaluminum) without a nitrogen precursor (ammonia) present, followed by growth of the nucleation layer 25, which may be a high temperature AlN material, for example. FIG. 7E, with reference to FIGS. 1 through 7D, is a flow diagram illustrating that the method 100 may comprise providing (140) a metal organic precursor material 65 on the vdW buffer layer 60, wherein a ratio of nitrogen-to-boron in a metal organic precursor material 65 is greater than approximately 450 to 4800, according to an example.

Figure 8A:
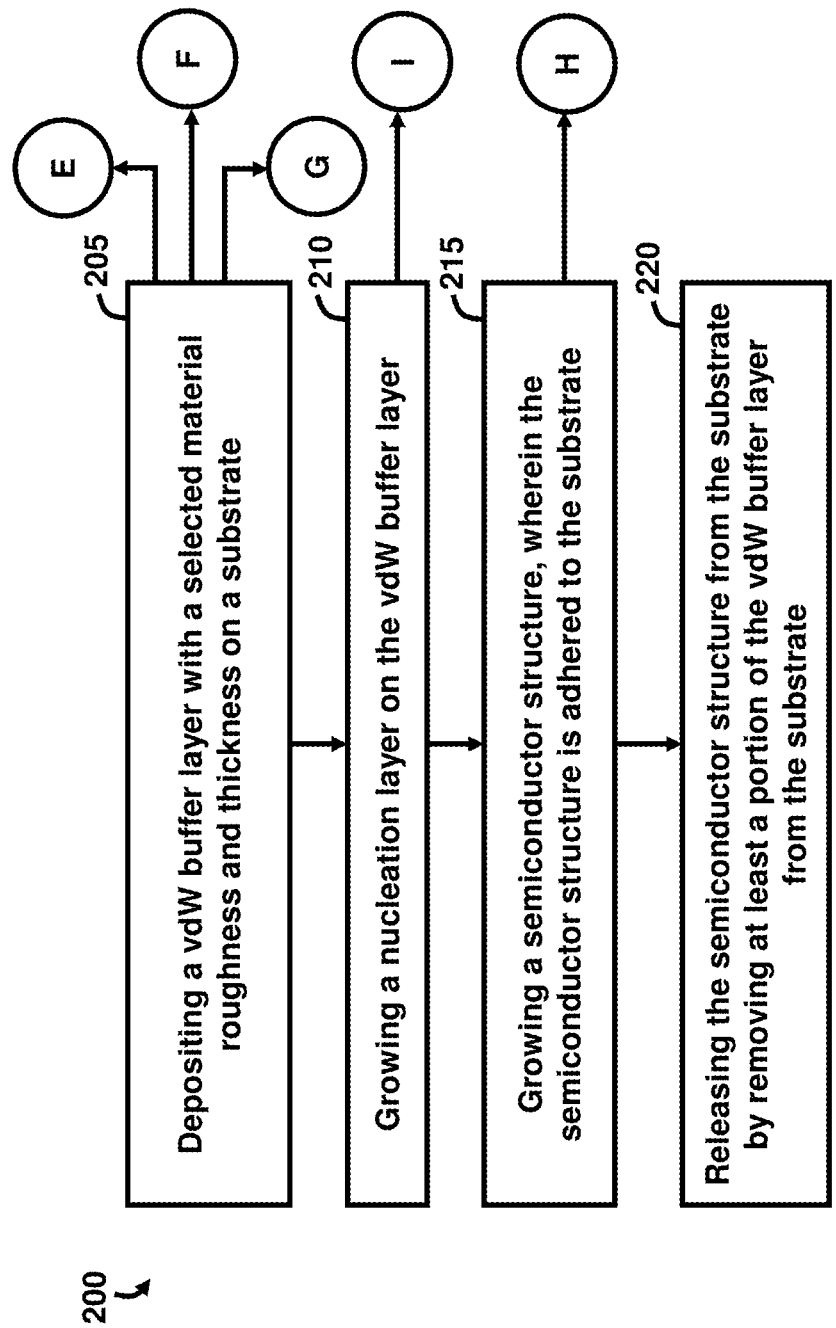
FIG. 8A is a flow diagram illustrating a method of epitaxially growing a semiconductor structure, according to an embodiment herein.

FIG. 8A, with reference to FIGS. 1 through 7E, is a flow diagram illustrating a method 200 of epitaxially growing a semiconductor structure 85, according to an embodiment herein. The method 200 comprises depositing (205) a vdW buffer layer 60 with a selected property or properties such as material roughness and thickness on a substrate (e.g., first substrate 15), and growing (210) a nucleation layer 25 on the vdW buffer layer 60 by (i) pulsing a metal organic precursor material 65 to the vdW buffer layer 60 to fix a polarity of a surface 70 of the nucleation layer 25 thereby creating a seed layer 75, and (ii) growing a nucleation material 80 on the seed layer 75. In this regard, the seed layer 75 may refer to a thin, catalyst film used to improve the growth process. The method 200 further comprises growing (215) a semiconductor structure 85, wherein the semiconductor structure 85 is adhered to the substrate (e.g., first substrate 15), and wherein a bonding strength of the semiconductor structure 85 to the substrate (e.g., first substrate 15) is controlled by the selected material roughness and thickness of the vdW buffer layer 60. The method of growing the semiconductor structure 85 may be performed using CVD and/or MOCVD techniques, for example. The method 200 further comprises releasing (220) the semiconductor structure 85 from the substrate (e.g., first substrate 15) by removing at least a portion of the vdW buffer layer 60 from the substrate (e.g., first substrate 15). Depending on the morphology of the vdW buffer layer 60; e.g., the material roughness and thickness, for example, the semiconductor structure 85 may be removed using chemical and/or mechanical techniques, as well as by self-separation of the semiconductor structure 85 from the substrate (e.g., first substrate 15) due to sufficiently weak bonding of the vdW buffer layer 60 to the substrate (e.g., first substrate 15).

FIG. 8B, with reference to FIGS. 1 through 8A, is a flow diagram illustrating that the method 200 may comprise altering (225) the selected material roughness of the vdW buffer layer 60 between a RMS roughness value of less than 0.1 nm to a RMS roughness value of approximately 2 nm. The process of altering (225) may occur during the process of depositing (205) the vdW buffer layer 60 on the substrate (e.g., first substrate 15) by selecting a desired material roughness of the vdW buffer layer 60, which alters the bonding strength of the semiconductor structure 85 to the substrate (e.g., first substrate 15). FIG. 8C, with reference to FIGS. 1 through 8B, is a flow diagram illustrating that the method 200 may comprise adjusting (230) a thickness of the vdW buffer layer 60 to control the bonding strength of the semiconductor structure 85 to the substrate (e.g., first substrate 15). Similar to the process of altering (225) the selected material roughness of the vdW buffer layer 60, the process of adjusting (230) may occur during the process of depositing (205) the vdW buffer layer 60 on the substrate (e.g., first substrate 15) by selecting a desired thickness of the vdW buffer layer 60.

FIG. 8D, with reference to FIGS. 1 through 8C, is a flow diagram illustrating that the method 200 may comprise depositing (235) the vdW buffer layer 60 at a temperature between approximately 900° C. to 1150° C. and a pressure of less than approximately 500 Torr. In other examples, if a low temperature GaN nucleation layer 25 is used, then the growth temperature may be between approximately 450° C. to 550° C. The process of depositing (235) the vdW buffer layer 60 may occur using CVD or MOCVD techniques, for example. FIG. 8E, with reference to FIGS. 1 through 8D, is a flow diagram illustrating that the method 200 may comprise controlling (240) a mechanical strain in the semiconductor structure 85 in order to more easily separate the semiconductor structure 85 from the substrate (e.g., first substrate 15). In this regard, by controlling the mechanically strain in the GaN nucleation layer 25, in particular, the bonding/adhesion strength between the substrate (e.g., first substrate 15) and the vdW buffer layer 60 is impacted. In some examples, the mechanical strain may be controlled by voltage-induced anisotropy, as well as the adjusting the growth parameters of the nucleation layer 25. FIG. 8F, with reference to FIGS. 1 through 8E, is a flow diagram illustrating that the method 200 may comprise growing (245) the nucleation layer 25 to approximately 15 nm in thickness.

Experiments and Results

The solutions provided by the embodiments herein were experimentally verified as described below. The following descriptions are only examples of the experiments conducted with respect to the embodiments herein, and accordingly the materials, processes, size and/or temperature parameters, and equipment, as well as the results that are achieved are only representative examples and are not meant to limit the scope of the embodiments herein.

Boron nitride films were deposited by MOCVD on sapphire at 1000° C. from TEB and $NH_3$ at V/III ratios ranging from 450 to 2700 and pressures ranging from 20 to 500 Torr. A vertical cold wall reactor with an actively cooled close-coupled showerhead was used. The BN/sapphire substrates were then loaded into a separate TurboDisc® style MOCVD system for growth of GaN and AlGaN/GaN (e.g., HEMT) structures. Ammonia, TMA, TMG, and silane were used as precursors for N, Al, Ga, and Si, respectively. For growth on BN/sapphire, an AlN nucleation layer was first deposited at 1000° C. using a V/III ratio of 2300. A standard process was used for the high temperature (1025° C.) growth of GaN. To investigate the 3D transport properties of GaN, samples were doped with Si in order to achieve a RT carrier concentration of $\sim 1 \times 10^{17}$ cm$^{-3}$. HEMT structures comprising a 2 µm GaN buffer, with an AlN insertion layer, AlGaN barrier with ~27% Al, and a GaN cap were grown. Prior to GaN growth, BN films were characterized by X-ray reflectance (XRR), Raman, and AFM to determine thickness, phase, bonding, and surface morphology. The structural properties of GaN and AlGaN/GaN structures were characterized by X-ray diffraction rocking curves of (0002) and (10$\bar{1}$2), under symmetric and quasi-symmetric ω-scan configurations respectively, using an Empyrean X'pert Pro™ system with a four bounce Ge monochrometer. The PL measurement of GaN was determined at RT and 10 K using a HeCd laser (325 nm) as the excitation source. Transport properties of Si doped GaN and the 2 DEG at the AlGaN/GaN hetero-interface were characterized by Hall effect measurements over the temperature range of 10-320 K.

Figure 9C:
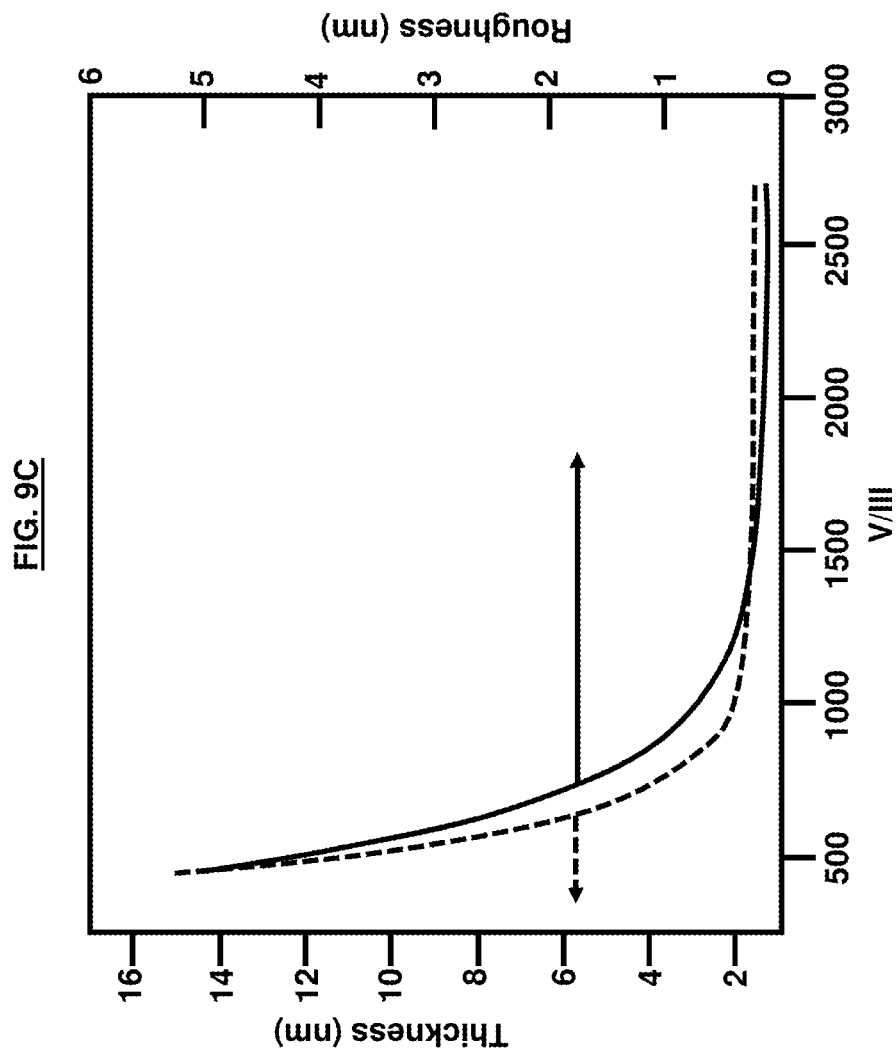
FIG. 9C is a graphical representation illustrating the effect of the V/III ratio on BN film thickness and roughness for 30-minute deposition times, according to an embodiment herein.
Figure 9D:
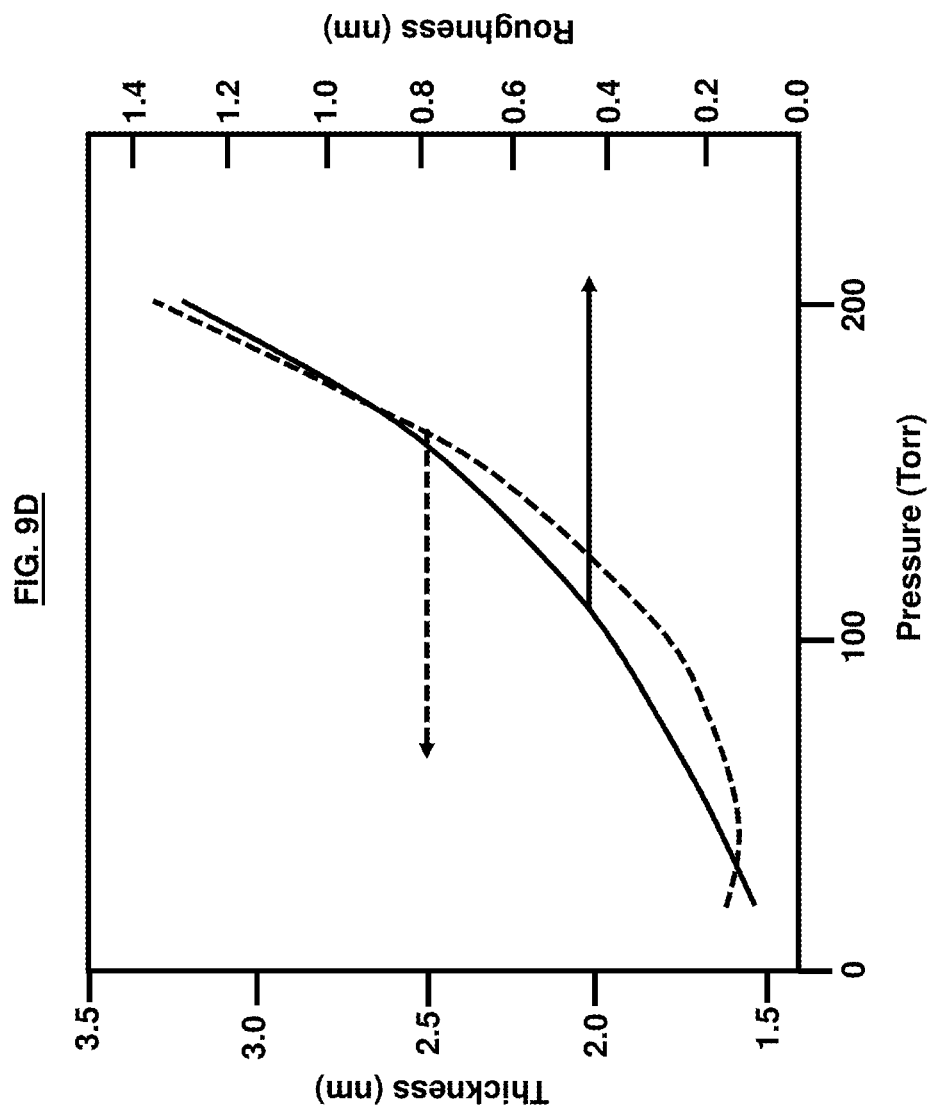
FIG. 9D is a graphical representation illustrating the effect of pressure on BN film thickness and roughness for 30-minute deposition times, according to an embodiment herein.

FIGS. 9A and 9B, with reference to FIGS. 1 through 8F, are AFM images of BN film grown at a low (450) V/III ratio and a high (2250) V/III ratio, respectively, according to an embodiment herein. Moreover, FIGS. 9A and 9B show the influence of the V/III ratio on the roughness of BN films. FIGS. 9C and 9D, with reference to FIGS. 1 through 9B, are graphical representations illustrating the effect of the V/III ratio and pressure, respectively, on BN film thickness and roughness for 30-minute deposition times, according to an embodiment herein. Two different growth modes may be observed depending on the V/III ratio and pressure; at a low V/III ratio or high pressure 3D island growth is dominant, whereas at a high V/III ratio and low pressure the growth transitions to a self-terminating mode. Under 3D growth conditions, turbostratic BN films containing randomly oriented nanograins with a rough surface are formed. Under self-terminating growth conditions films are found to be atomically smooth with a thickness of ~1.6 nm, which is independent of growth time (>2 min). The results of a two-inch BN layer on a sapphire substrate grown under self-terminating conditions is shown in FIG. 9D.

At five spots across the substrate, AFM and Raman characterization were performed, with the corresponding RMS roughness and the FWHM of the BN $E_{2g}$ Raman peak given at each location shown in FIG. 9E, with reference to FIGS. 1 through 9D. The measured RMS roughness is <0.1 nm at all points except spot five. Similarly, the Raman spectra are very consistent in spots 1 through 4. Spot 5 is located on the outer edge of the wafer carrier where the temperature and gas flows are likely to be different than near the center, which can explain the discrepancy. Films grown under 3D growth conditions also have good uniformity. Similar five-point maps performed for a film grown at a V/III ratio of 900 (not shown) exhibit Raman spectra with $E_{2g}$ FWHM ranging from 32 to 29 cm$^{-1}$, roughness from 1 to 1.2 nm, and thickness from 2.3 to 2.7 nm. These BN films are very uniform and provide an excellent substrate for growth of GaN and AlGaN/GaN structures. To study the effect of BN morphology on the GaN crystalline quality, a series of six GaN films (2 µm thick) were grown in the same run on different BN/sapphire substrates. Table 1 gives details of these six samples including: BN process conditions (V/III ratio and pressure), BN thickness and RMS roughness, as well as the FWHM of the GaN (0002) and (10$\bar{1}$2).

TABLE 1

| BN P (Torr) | BN V/III | BN RMS (nm) | BN Thickness (nm) | GaN FWHM (0002) | GaN FWHM (10$\bar{1}$2) | GaN Separation |
|---|---|---|---|---|---|---|
| 20 | 900 | 1 | 2.5 | 0.22° | 0.47° | Yes |
| 20 | 1575 | 0.25 | 1.7 | 0.20° | 0.42° | No |
| 250 | 2250 | 0.1 | 1.6 | 0.18° | 0.23° | No |
| 50 | 2250 | 0.2 | 1.6 | 0.19° | 0.42° | No |
| 100 | 2250 | 0.4 | 1.8 | 0.19° | 0.49° | Yes |
| 200 | 2250 | 1.3 | 3.3 | N/A | N/A | Yes |

Figure 10A:
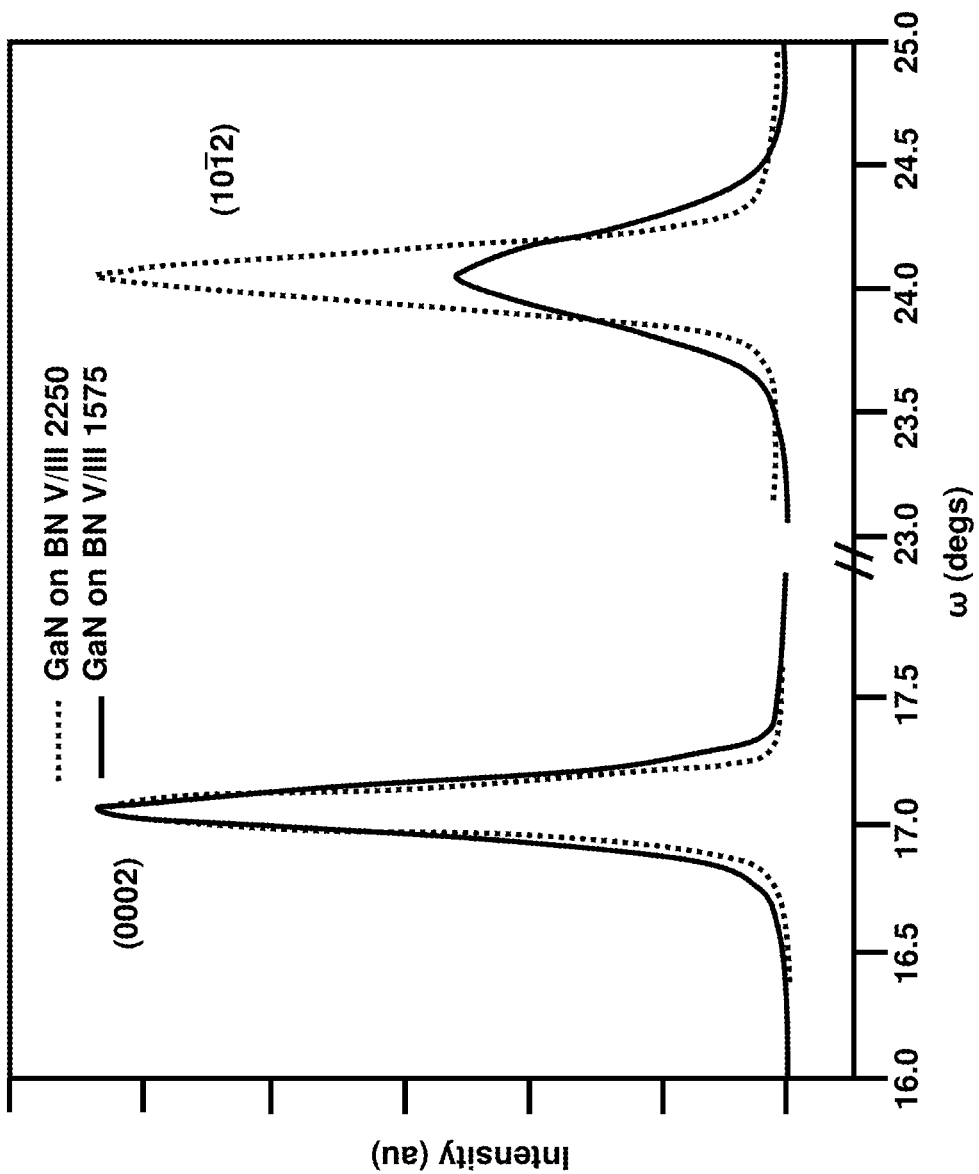
FIG. 10A is a graphical representation illustrating X-ray rocking curves of (0002) and (10$\bar{1}$2) of GaN grown on different BN substrates, according to an embodiment herein.

As described above, V/III ratio and pressure used for BN deposition may significantly impact its morphology, which in turn significantly impacts the GaN quality. Four of the six BN substrates used here have approximately the same thickness, but roughness varying from 0.1 to 0.4 nm. Comparison of these samples strongly suggests that BN roughness has the biggest impact. FIG. 10A, with reference to FIGS. 1 through 9E, shows the X-ray rocking curves from GaN films grown on a BN substrate (V/III ratio 2250) with a very smooth surface morphology (<0.1 nm) and on a BN substrate (V/III 1575) with a rougher surface morphology (~0.25 nm). Broadening is observed in both the (0002) and (10$\bar{1}$2) of GaN grown on the rougher BN. FIGS. 10B and 10C, with reference to FIGS. 1 through 10A, plot the GaN FWHM as a function of V/III ratio and BN growth pressure. The GaN FWHM from samples grown on smooth BN substrates (V/III 2250) are comparable to industry standards of GaN growth on BN and graphene.

A series of Si-doped GaN grown on a range of BN substrates was used to study the bulk transport properties. Table 2 gives RT Hall mobility, carrier concentration, and maximum mobility for four Si-doped GaN samples grown on various BN substrates and two AlGaN/GaN samples grown on BN substrates with high (2250) and low (900) V/III ratios. The Si-doped GaN samples were all grown in the same run and, therefore, have very similar RT carrier concentration (~1.2×10$^{17}$ cm$^3$). However, the mobility changes noticeably from 390 to 520 cm$^2$/Vs, with higher values corresponding to lower XRD FWHM (Table 1).

TABLE 2

| BN substrate P\|V/III | Si—GaN $\mu_{300K}$ (cm$^2$/Vs) | Si—GaN $N_{300K}$ (cm$^{-3}$) | Si—GaN $\mu_{max}$ (Temp) | AlGaN/GaN $\mu_{300K}$ (cm$^2$/Vs) | AlGaN/GaN $\mu_{10K}$ (cm$^2$/Vs) |
|---|---|---|---|---|---|
| 20 Torr\|900 | 395 | 1.3 × 10$^{17}$ | 620 (155 K) | 1630 | 15200 |
| 20 Torr\|1575 | 438 | 1.32 × 10$^{17}$ | N/A | N/A | N/A |
| 20 Torr\|2250 | 520 | 1.25 × 10$^{17}$ | 850 (150 K) | 1950 | 33000 |
| 50 Torr\|2250 | 423 | 1.2 × 10$^{17}$ | 680 (155 K) | N/A | N/A |

Figure 11A:
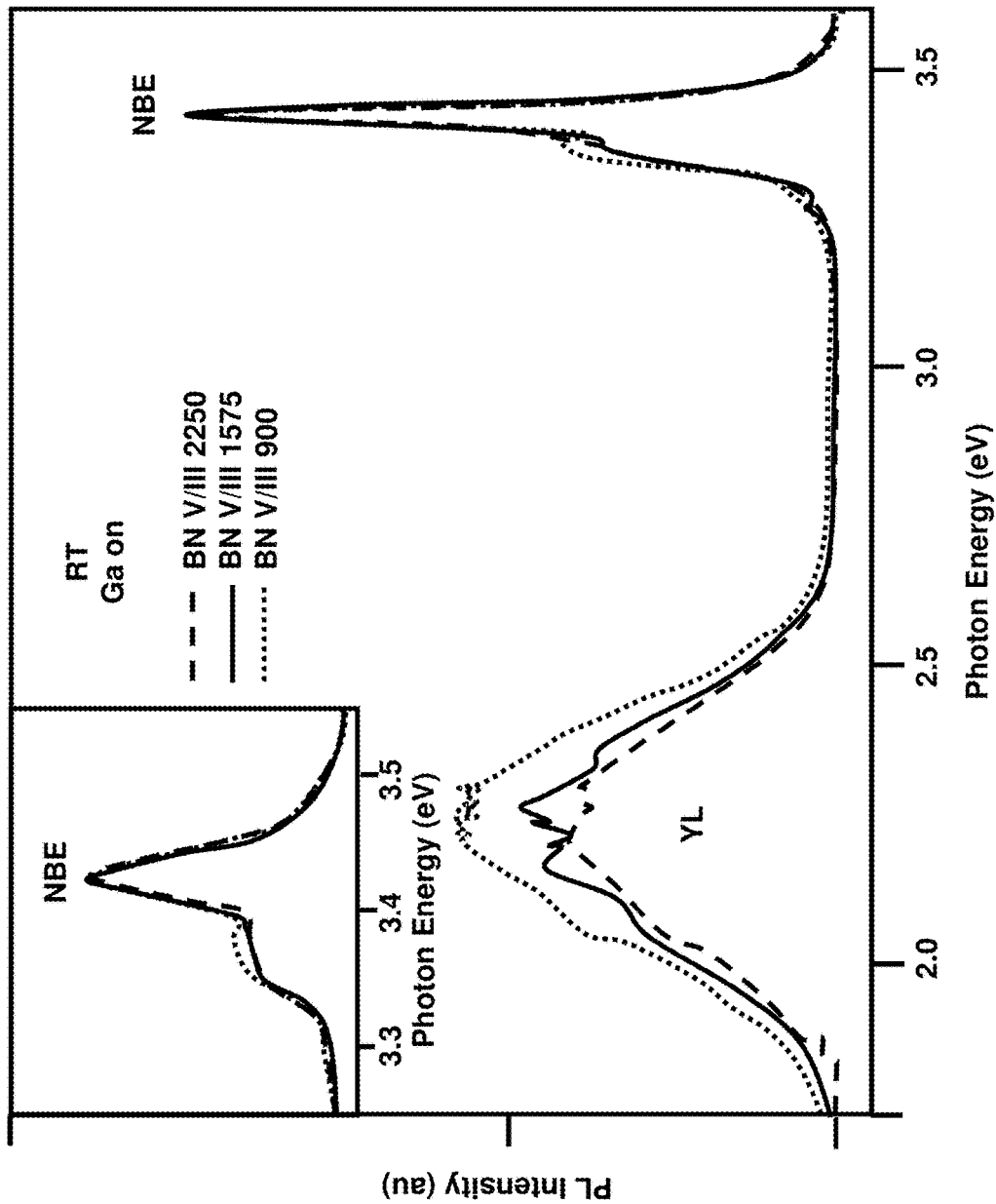
FIG. 11A is a graphical representation illustrating photoluminescence (PL) spectra from GaN grown on four BN substrates with various morphology including BN V/III 900 (RMS>1 nm), BN V/III 1575 (RMS~0.25 nm), BN V/III 2250 (RMS<0.1 nm), and BN 2250P 100 Torr (RMS~0.4 nm) taken at room temperature (RT) with the inset showing an expanded view of the NME portion of the RT spectrum, according to an embodiment herein.

A direct relationship between the BN morphology and self-separation of the GaN layer is observed for GaN film grown on a BN substrate produced at a pressure of 200 Torr. Table 1 summarizes parameters of any separation of the GaN film from the substrate after growth. To further study the effect of the BN film morphology on GaN quality, PL measurements were performed at RT and low temperature (10 K). FIG. 11A, with reference to FIGS. 1 through 10C, shows RT PL from GaN grown on three BN substrates with varying roughness: BN V/III 900 (RMS>1 nm), BN V/III 1575 (RMS~0.25 nm), and BN V/III 2250 (RMS<0.1 nm). From all samples, clear near-band-edge (NBE) emission and defect related yellow (at ~2.25 eV) emission are observed. Comparison of these two samples show a slight red shift in the NBE from 3.426 to 3.421 eV going from GaN grown on smooth to rough BN. Emission of the yellow band is stronger in GaN grown on the rougher BN substrates, which is consistent with the increase in FWHM of XRD rocking curve shown in FIGS. 10A through 10C. The observed shift in the RT NBE is likely due to a relaxation of strain. To more closely observe these effects the PL at 10 K is examined, which is shown in FIG. 11B, with reference to FIGS. 1 through 11A.

Strong emissions peaks corresponding to neutral-donor-bound-exciton (D°X$_A$) and Y1 defect related transitions are observed. A series of additional low intensity peaks separated by ~90 meV attributed to LO phonon replicas are also observed. A slight red shift of 2 meV in the position of the D°X$_A$ is observed with increasing BN substrate roughness. On the low energy side of the spectra, very weak and broad emission peaks are observed in the range of 2-2.5 eV, corresponding to the defect-related yellow luminescence. Similar to RT measurements, an increase in the defect-related emission in GaN grown on the rough BN substrate is observed. Additionally, a small increase in the Y$_1$ emission intensity is observed indicating an increase in inversion domain related dislocations. The corresponding broadening of the (0002) X-ray rocking curve may partially be due to this increase in the number of inversion domains. The increase in defect related emission is well correlated with the X-ray results discussed above showing a clear increase in defects due to the rough BN substrate.

Figure 12A:
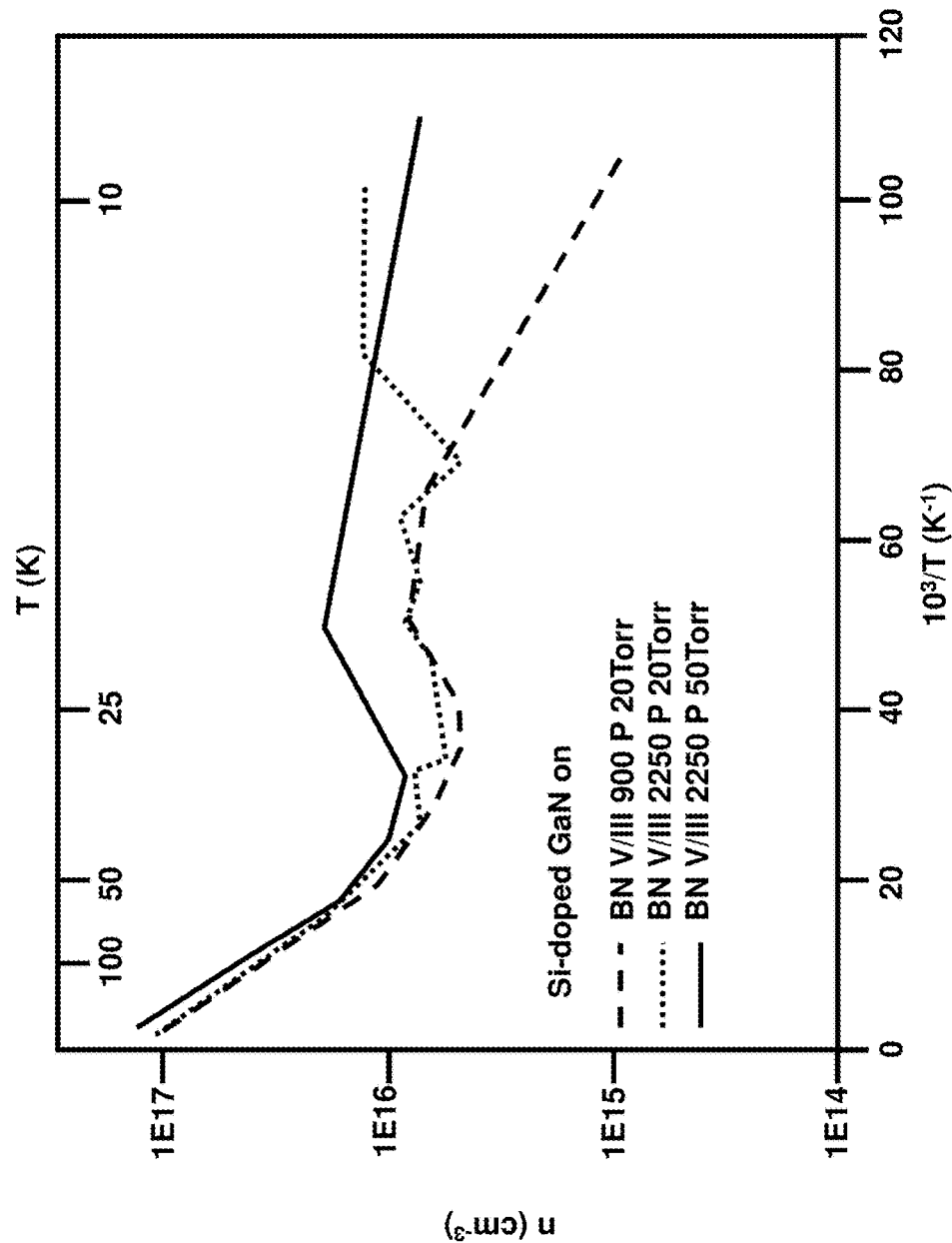
FIG. 12A is a graphical representation illustrating the carrier concentration (n) as a function of temperature for Si-doped GaN grown on BN substrates with high V/III (2250), low V/III (900), and high pressure (50 Torr), according to an embodiment herein.
Figure 12B:
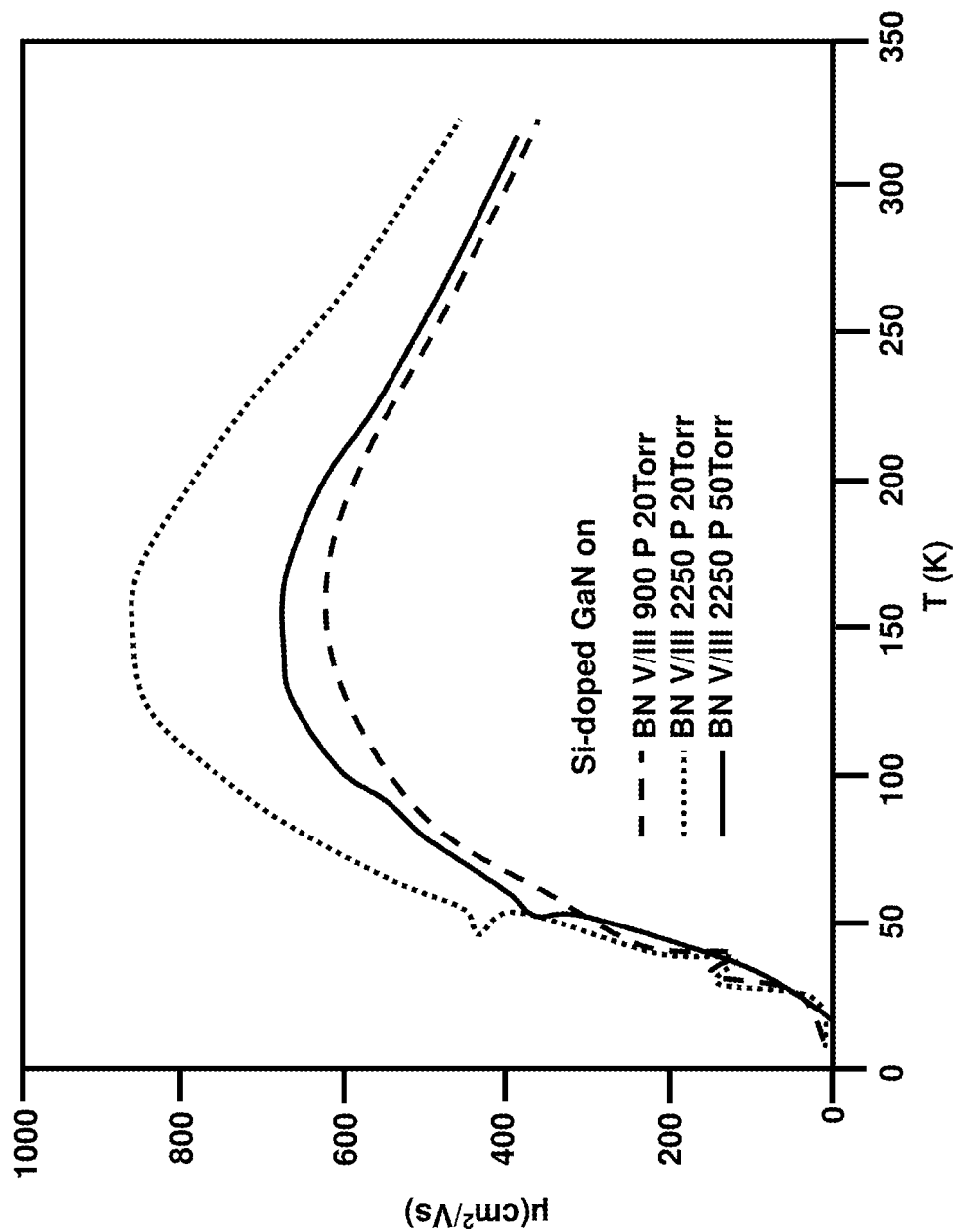
FIG. 12B is a graphical representation illustrating the carrier mobility as a function of temperature for Si-doped GaN grown on BN substrates with high V/III (2250), low V/III (900), and high pressure (50 Torr), according to an embodiment herein.

FIGS. 12A and 12B, with reference to FIGS. 1 through 11B, are graphical representations illustrating the carrier concentration (n) and carrier mobility, respectively, as a function of temperature for Si-doped GaN grown on BN substrates with high V/III (2250), low V/III (900), and high pressure (50 Torr), according to an embodiment herein. Again, the carrier concentration is fairly consistent across these samples and is dominated by the Si donor concentration. The mobility is well correlated to the FWHM of GaN XRD rocking curves and BN morphology. This may be due to the high dislocation densities in GaN, which are known to affect carrier mobility.

Figure 12C:
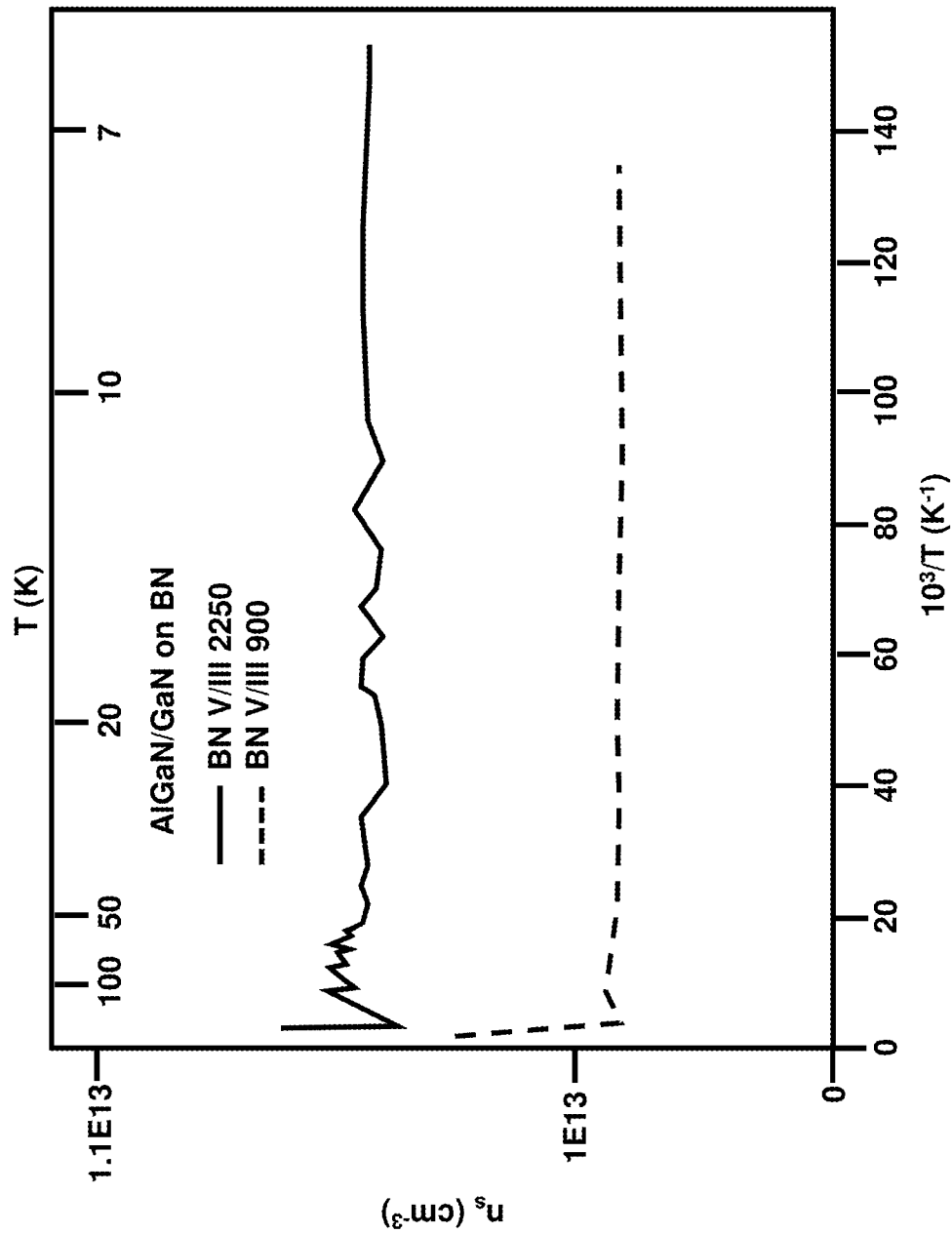
FIG. 12C is a graphical representation illustrating two-dimensional electron gas (2 DEG) sheet carrier density ($n_s$) from AlGaN/AlN/GaN on BN substrates grown at a high V/III (2250) and low V/III (900), according to an embodiment herein.
Figure 12D:
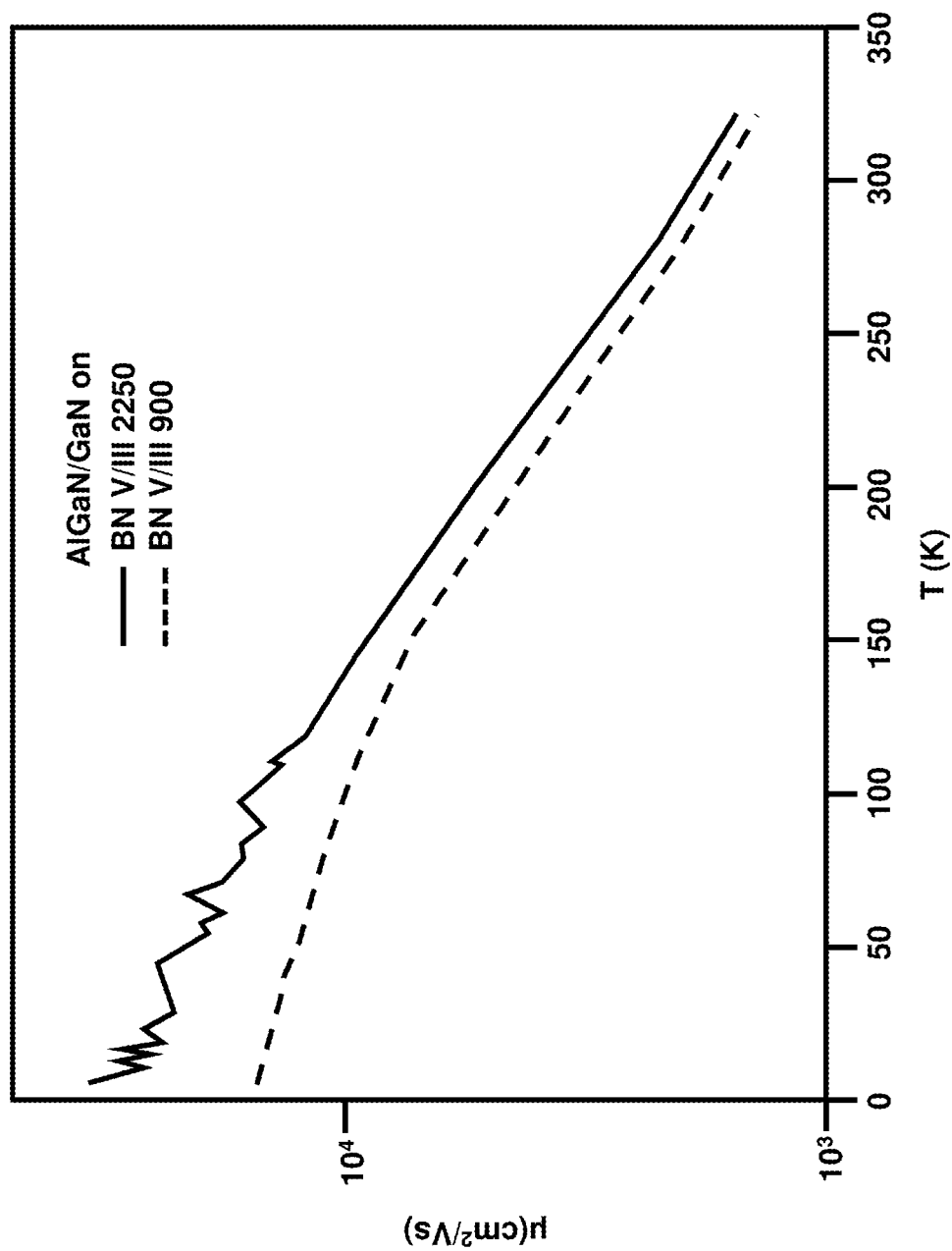
FIG. 12D is a graphical representation illustrating the carrier mobility from AlGaN/AlN/GaN on BN substrates grown at a high V/III (2250) and low V/III (900), according to an embodiment herein.

FIGS. 12C and 12D, with reference to FIGS. 1 through 12B, show temperature dependent Hall measurements from two AlGaN/GaN samples grown on BN substrates with high surface roughness (BN V/III 900) and low surface roughness (BN V/III 2250). Both samples exhibit nearly constant sheet carrier densities (nsh) as a function of temperature, typical of a 2 DEG. A slight (~3%) increase in nsh at RT is observed for BN:V/III 900 indicating a very small parallel conduction from the GaN buffer, which could impact measured RT mobility. At low temperatures, any contribution from the GaN buffer should be frozen out isolating the 2 DEG transport. A significantly decreased low temperature 2 DEG mobility is observed for BN V/III 900. This decrease in mobility may be caused by increased interfacial roughness and/or dislocation scattering as a result of the BN substrate morphology. However, in the range of dislocation densities present (2.5×10$^8$-5×10$^8$ cm$^{-2}$ measured by TEM), interfacial roughness is expected to be the dominant scattering mechanism, not dislocation scattering. From AFM characterization of each sample, a slight increase in RMS roughness from 0.28 to 0.30 nm is observed for BN V/III 2250 and BN V/III 900. An increase in roughness at the AlGaN/GaN interface does not necessarily translate into an increase in final surface roughness.

Figure 13A:
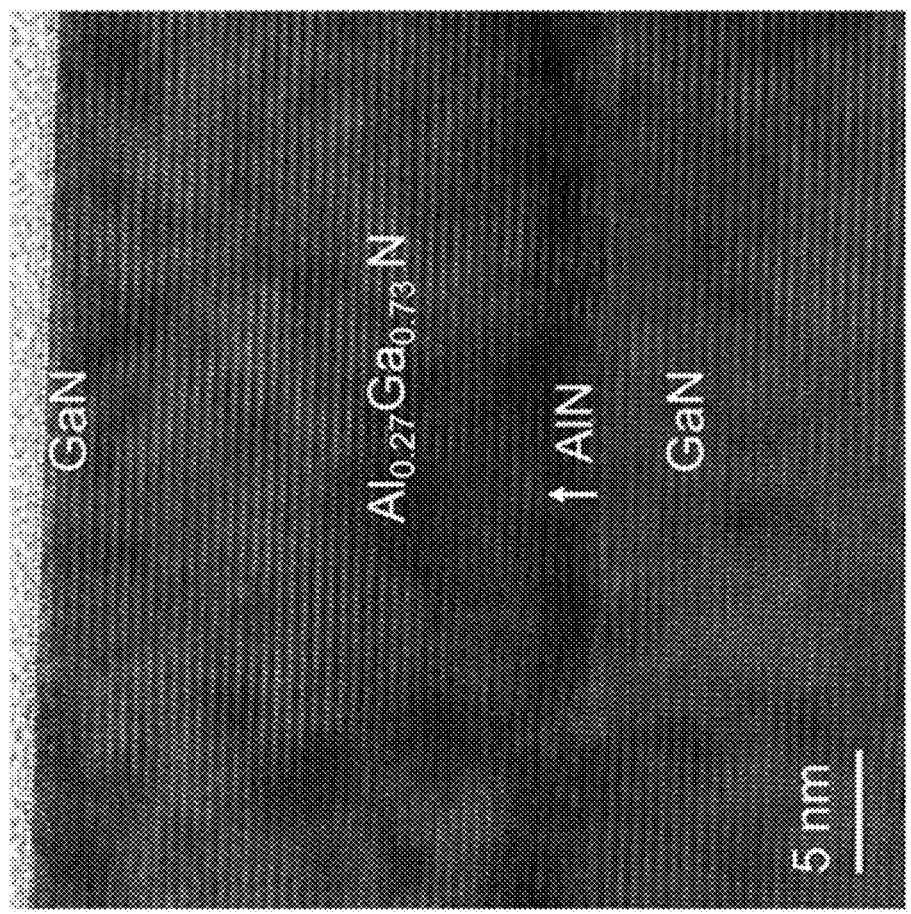
FIG. 13A is a high-resolution transmission electron microscopy (HRTEM) image from an AlGaN/AlN/GaN interface region of an experimental sample on a BN V/III 2250 substrate, according to an embodiment herein.
Figure 13B:
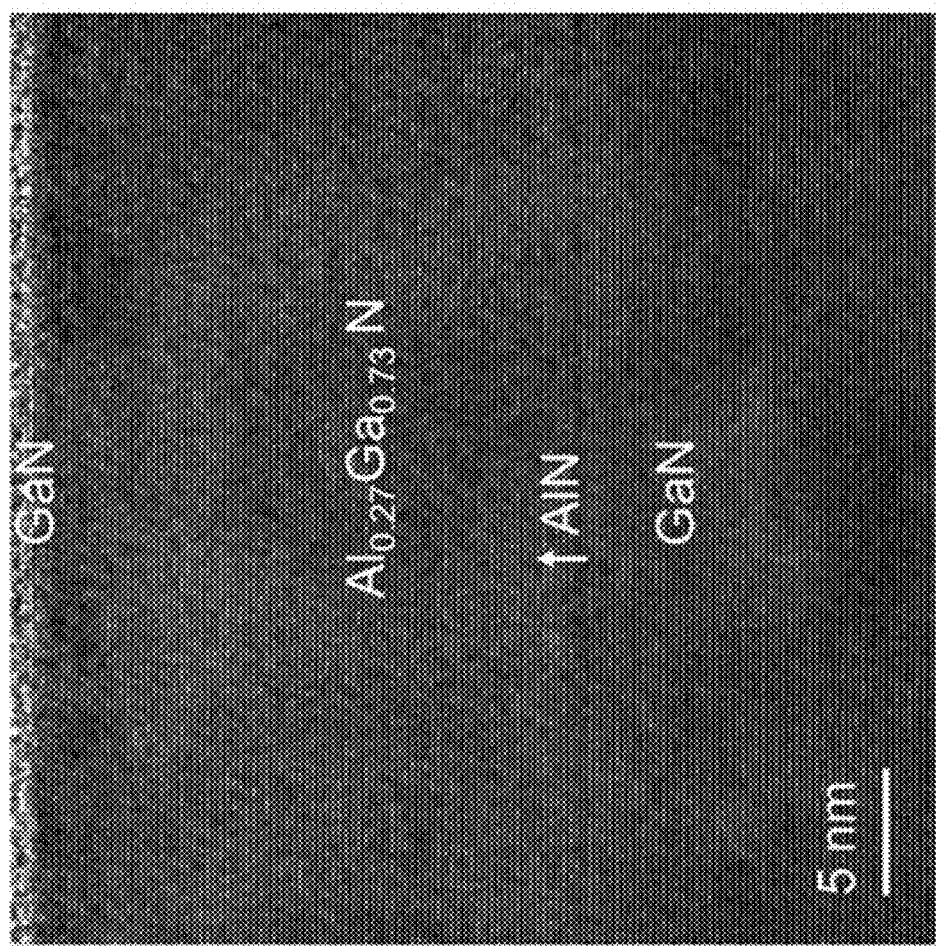
FIG. 13B is a high-resolution transmission electron microscopy (HRTEM) image from an AlGaN/AlN/GaN interface region of an experimental sample on a BN V/III 900 substrate, according to an embodiment herein.

High resolution (HR) TEM analysis was performed to reveal structural defects in these samples, such as interfacial roughness and threading dislocations (TD). FIGS. 13A and 13B, with reference to FIGS. 1 through 12D, show HR-TEM images of the AlGaN/GaN interfaces from these two samples. Initial inspection shows that the structure of each sample is very similar with a ~2 nm thick AlN insert layer and 17 nm AlGaN barrier layer. From energy dispersive X-ray spectroscopy (EDS) (not shown) the barrier composition for both samples (within 1% error) was 27% Al and 73% Ga. Upon closer inspection, it can be seen that both samples have very high quality and abrupt interfaces with no observable difference in interfacial roughness. To compare the effect of BN morphology on TD density, dislocation analysis of the GaN buffer was also performed with g=[0002] and [1100]. By imaging with g=[0002] and [1100], it is possible to count and distinguish between edge, screw, and mixed (reaction between edge and screw-type) TDs. Total GaN dislocation densities of $2.5 \times 10^8$ and $5 \times 10^8$ cm$^{-2}$ were measured for BN V/III 2250 and V/III 900 samples, respectively. These densities are comparable to GaN grown on conventional substrates (sapphire and SiC). In BN V/III 2250 the observed TD in the analysis area were either edge or mixed type, while in BN V/III 900 edge, screw, and mixed were all observed. Mixed type TD make up more than 50%, which is similar to industry standards of GaN grown on graphene using a ZnO NL. In order to explain the reduction in low temperature mobility to ~15,000 cm$^2$/Vs (BN V/III 900), a TD density on the order of $10^{10}$ cm$^2$ would be required. Therefore, the observed double increase in TD density would not be significant enough to cause such a decrease in 2 DEG mobility.

The combined experimental results presented above show a strong correlation between the BN substrate morphology and GaN quality. In particular, roughness has a significant impact as observed in X-ray broadening of the GaN in-plane (10$\bar{1}$2) rocking curve. Broadening in the out-of-plane orientation (0002) is also observed but to a lesser extent.

Since GaN growth on BN proceeds through island nucleation and coalescence, a small increase in substrate roughness (1-2 nm) is not expected to have a major impact on out-of-plane dislocations (TDs with screw type component) when compared to the coalescing islands. On the other hand, this BN roughness may lead to more random 3D growth and alignment of the nucleating islands, which could strongly impact the in-plane orientation leading to an increase in edge-type dislocations, as observed in TEM.

The effects of BN substrate morphology on the structural, optical, and transport properties of GaN are demonstrated experimentally as described above. XRD, PL, and TEM show a clear increase in GaN defect and dislocation density due to BN substrate roughness. BN roughness appears to facilitate self-separation of the GaN layer from the substrate. PL also showed relaxation of the GaN strain due to growth on a rougher BN surface. Transport measurements demonstrate a strong correlation between 3D and 2 DEG transport and BN morphology. The 3D transport appears to be strongly affected by higher GaN dislocation densities on rougher BN substrates, and based on measured TD densities ($2.5 \times 10^8$-$5 \times 10^8$ cm$^{-2}$) the low temperature 2 DEG transport appears to be limited by interfacial roughness between the AlN and GaN layers. By comparing such a wide range of BN substrate morphologies, the embodiments herein have identified key features (roughness) for high quality GaN device structures and easily separated free standing materials.

According to one example, the embodiments herein provide a group III-nitride thin film (e.g., semiconductor layer 33 or semiconductor structure 85) grown epitaxially on a thin hBN vdW buffer layer 60 using a thin AlN nucleation layer 25 for mechanical lift-off from the growth substrate (e.g., first substrate 15) and transfer to an arbitrary substrate (e.g., second substrate 55). The morphology of the hBN buffer layer 60 is used to control the bonding strength of the III-nitride films to the growth substrate (e.g., first substrate 15). Weakly bonded films can be easily separated and transferred for simple processing, while more strongly bonded films are necessary for aggressive pretransfer device processing. Accordingly, the embodiments herein utilize the morphology and thickness of the vdW buffer layer 60 as a way to vary the bonding strength of the III-nitride film (e.g., semiconductor layer 33) to the growth substrate (e.g., first substrate 15).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A semiconductor device comprising:
   a first substrate;
   a mechanical release layer comprising a predetermined material roughness and thickness adjacent to the first substrate;
   a nucleation layer adjacent to the mechanical release layer; and
   a first semiconductor layer attached to the nucleation layer,
   wherein the first semiconductor layer, the nucleation layer, and a portion of the mechanical release layer are configured to be releasably connected to the first substrate,
   wherein the predetermined material roughness and thickness of the mechanical release layer determines a bonding strength of the mechanical release layer to the first substrate, and
   wherein the mechanical release layer comprises a substantially non-planar surface interfacing with the nucleation layer.

2. The semiconductor device of claim 1, comprising:
   an aluminum nitride insert layer adjacent to the first semiconductor layer;
   an aluminum gallium nitride barrier layer adjacent to the aluminum nitride insert layer; and
   a second semiconductor layer adjacent to the aluminum gallium nitride barrier layer.

3. The semiconductor device of claim 1, comprising a second substrate attached to the released first semiconductor layer.

4. The semiconductor device of claim 1, wherein the mechanical release layer comprises a van der Waals (vdW) buffer layer.

5. A method comprising:
   growing a van der Waals (vdW) buffer layer of a predetermined material roughness and thickness on a first substrate;
   providing a metal organic precursor material on the vdW buffer layer, wherein a ratio of nitrogen to boron in the metal organic precursor material is greater than approximately 450 to 4800;
   depositing a nucleation layer on the vdW buffer layer; and
   growing a semiconductor layer on the nucleation layer, wherein the semiconductor layer is characterized by a bonding strength to the first substrate that varies according to the predetermined material roughness and thickness of the vdW buffer layer.

6. The method of claim 5, comprising:
removing the semiconductor layer from the first substrate; and
transferring the removed semiconductor layer to a second substrate.

7. The method of claim 6, wherein removing the semiconductor layer from the first substrate comprises using a mechanical lift-off process.

8. The method of claim 5, wherein the semiconductor layer comprises any of GaN, AlN, InN, and alloys thereof.

9. The method of claim 5, comprising adjusting a temperature while growing the vdW buffer layer, wherein the bonding strength is further characterized by the temperature.

10. The method of claim 5 wherein the nucleation layer is approximately between 5 nm and 50 nm.

11. The method of claim 5, wherein depositing the nucleation layer on the vdW buffer layer further comprises crystallographically orienting the nucleation layer by exposing a surface of the vdW buffer layer to a metal organic precursor material.

12. A method comprising:
depositing a van der Waals (vdW) buffer layer with a selected material roughness and thickness on a substrate, comprising:
depositing a vdW buffer layer having a RMS roughness value less than 0.1 nm, and
altering the vdW buffer layer to have a RMS roughness value of approximately 2 nm;
growing a nucleation layer on the vdW buffer layer by (i) pulsing a metal organic precursor material to the vdW buffer layer to fix a polarity of a surface of the nucleation layer thereby creating a seed layer, and (ii) growing a nucleation material on the seed layer;
growing a semiconductor structure, wherein the semiconductor is adhered to the substrate, and wherein a bonding strength of the semiconductor structure to the substrate is controlled by the selected material roughness and thickness of the vdW buffer layer; and
releasing the semiconductor structure from the substrate by removing at least a portion of the vdW buffer layer from the substrate.

13. The method of claim 12, comprising adjusting a thickness of the vdW buffer layer to control the bonding strength of the semiconductor structure to the substrate.

14. The method of claim 12, comprising depositing the vdW buffer layer at a temperature between approximately 900° C. to 1150° C. and a pressure of less than approximately 500 Torr.

15. The method of claim 12, comprising controlling a mechanical strain in the semiconductor structure.

16. The method of claim 12, comprising growing the nucleation layer to approximately 15 nm in thickness.

* * * * *